(12) United States Patent
Vernackt

(10) Patent No.: US 6,369,877 B2
(45) Date of Patent: Apr. 9, 2002

(54) SYSTEM, METHOD AND ARTICLE OF MANUFACTURE FOR DIRECT IMAGE PROCESSING OF PRINTED CIRCUIT BOARDS

(75) Inventor: Marc Vernackt, Overmere (BE)

(73) Assignee: ManiaBarlo, N. V., Zwijnaarde (BE)

( * ) Notice: Subject to any disclaimer, the term of this patent is extended or adjusted under 35 U.S.C. 154(b) by 0 days.

(21) Appl. No.: 09/909,545

(22) Filed: Jul. 19, 2001

Related U.S. Application Data

(62) Division of application No. 09/511,646, filed on Feb. 22, 2000.

(51) Int. Cl.[7] .................. G03B 27/58; G03B 27/32; G03B 27/42; G03B 27/54; A61N 5/00
(52) U.S. Cl. .................. 355/72; 355/26; 355/53; 355/67; 355/71; 250/492.2; 250/492.22
(58) Field of Search ...................... 355/26, 53, 67, 355/71, 72; 250/492.2, 492.22

(56) References Cited

U.S. PATENT DOCUMENTS 4,221,974 A * 9/1980 Mueller et al.
5,627,378 A * 5/1997 Baxter
5,923,403 A * 7/1999 Jain
5,933,216 A * 8/1999 Dunn

* cited by examiner

Primary Examiner—Russell Adams
Assistant Examiner—Khaled Brown
(74) Attorney, Agent, or Firm—Dov Rosenfeld; Inventek

(57) ABSTRACT

A system and method is disclosed that provides an automated, flow-through, dual side, laser direct imaging process and apparatus. This provides the capability to simultaneously register and image both sides of a substrate in a continuous flow-through process. The present invention provides efficiency improvements over the prior art on several levels. First, the prior art is batch process in which substrates are imaged one (or a batch) at a time in contrast with the present invention is a continuous, flow through, sequential process whereby a first substrate is followed into the apparatus by a second substrate which is, in turn followed by a third and so forth and the second substrate begins the process through the apparatus before the first substrate completes the process through the apparatus. Second, the process time per substrate is reduced as compared to the prior art.

26 Claims, 21 Drawing Sheets

FRONT VIEW

TOP VIEW

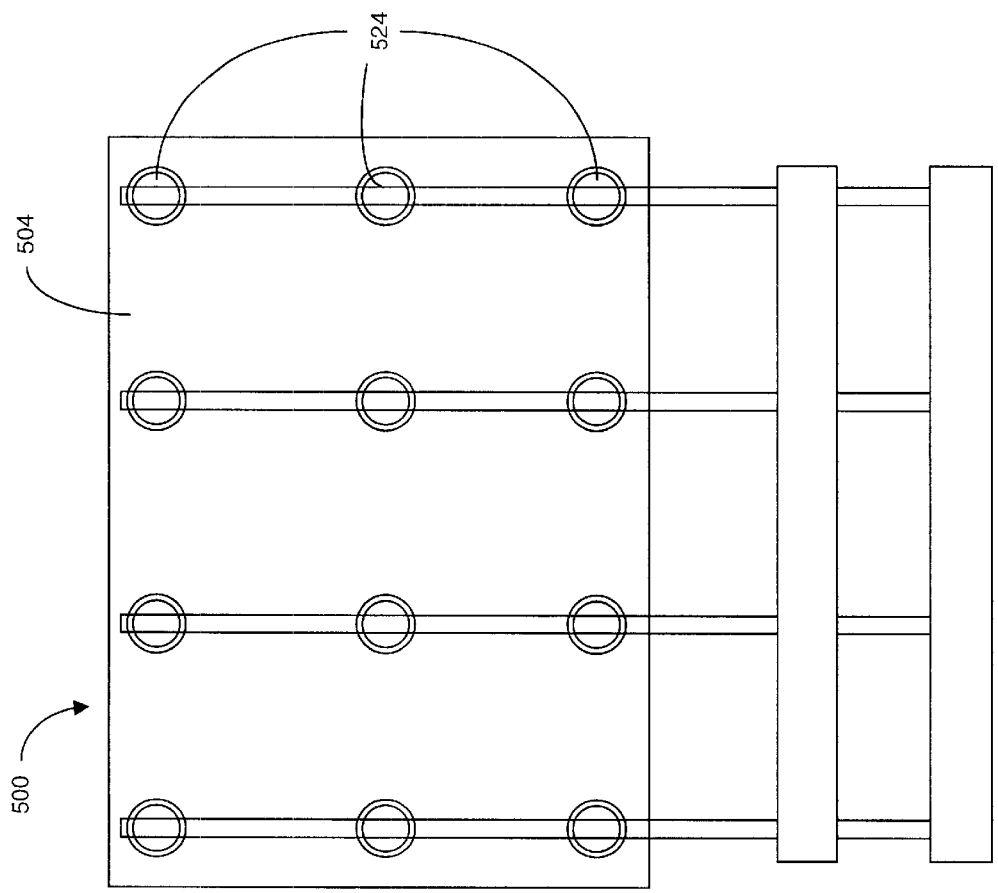
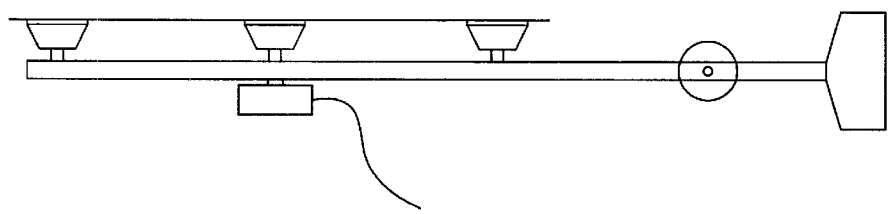
FIG. 5B

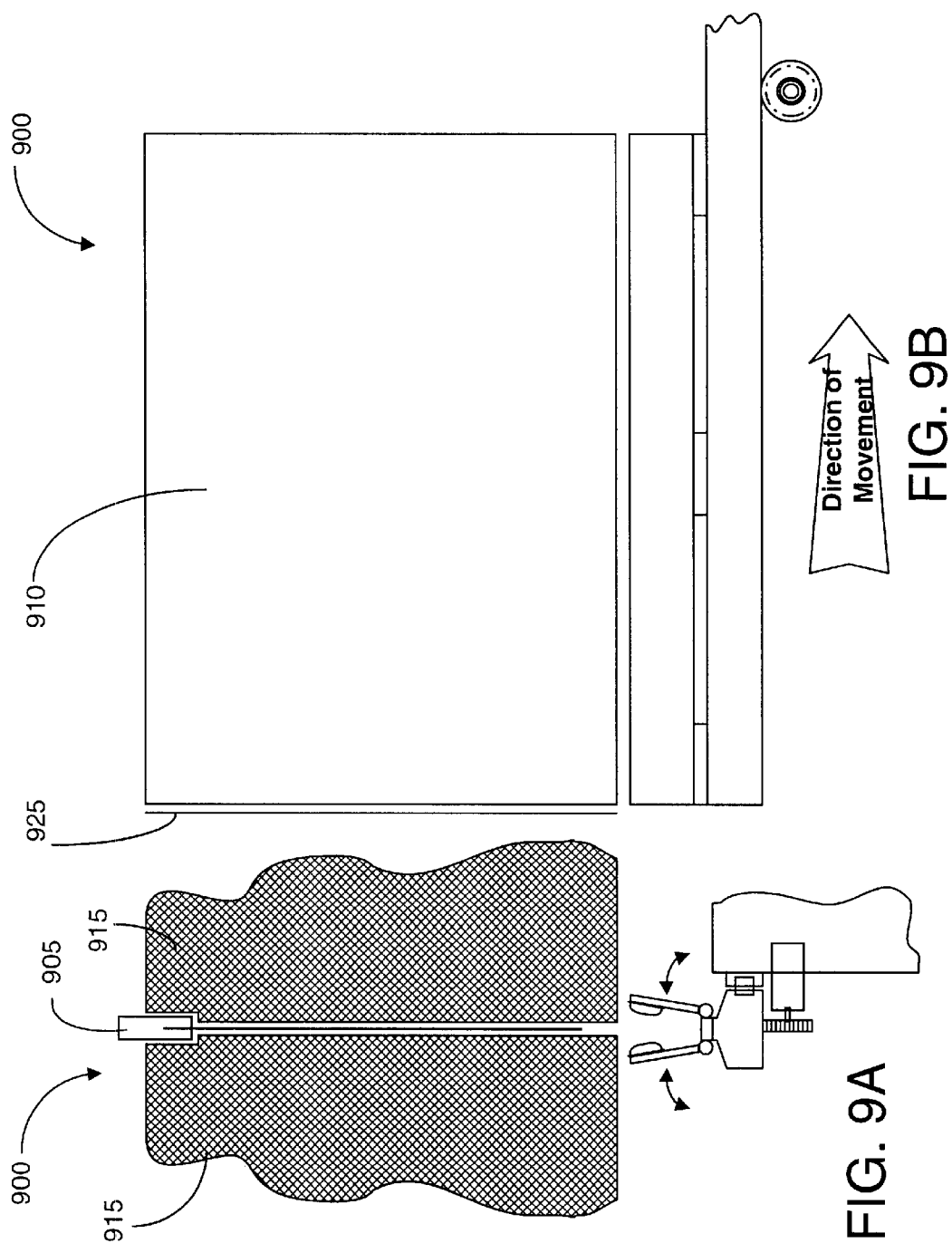

SYSTEM, METHOD AND ARTICLE OF MANUFACTURE FOR DIRECT IMAGE PROCESSING OF PRINTED CIRCUIT BOARDS

This application is a Division of Ser. No. 09/511,646 filed Feb. 22, 2000.

This application is related to co-pending U.S. patent application Ser. No. 09/435,983, entitled: METHOD AND DEVICE FOR EXPOSING BOTH SIDES OF A SHEET, by Inventor(s): Marc Vernackt, Ronny De Loor, Anne-Marie Empsten, and Mark Ryvkin, filed: Nov. 8, 1999, which is incorporated by reference herein for all purposes.

BACKGROUND

The present invention relates to direct image printing and more specifically to an automated method of handling and processing printed circuit board panels, printing plates, or other sensitized sheets through a direct imaging process.

It is known today that printed circuit boards may be composed of several PCB panels, each panel having two sides, one or more of which is provided with a layer forming an electrical circuit. When there is only one panel having only two layers, the board is commonly called a double-sided board, and when there are more than two layers, the board is commonly called a multi-layer board. A common way of manufacturing a multi-layer board is by fixing several panels together, each panel having a single printed circuit on one side, or a circuit on each side. "Outer" panels are those that face the outside of a multi-layer PCB, and "inner panels" are the interior panels. Typically, the inner panels have a circuit on both sides, while the outer panels have a circuit only on one, the outer side. Each inner panel resembles a thin double-sided PCB in that the panel is comprised of an insulating substrate which is clad on both sides with metallic foil, typically copper foil. A printed circuit is formed on any circuit side of an inner panel by that side's metal cladding having a light-sensitive layer laid on top of the metal. The light-sensitive layer is exposed to light (typically ultra-violet (UV) radiation) at selected locations, then processed by a photographic process that removes the layer at selected locations. An etching process is then applied to remove those parts of the layer of metal not necessary for forming the actual circuit. Once all the double-sided inner panels are produced, they are fused (pressed) together by placing an insulating binding material, typically a partially cured epoxy-resin material called prepreg, between the panels. Unexposed outer foils are placed on the outside of the double-sided inner panels, again with prepreg in between. All the layers are now laminated by applying heat and pressure that causes the prepreg to flow and bond to the surfaces of the inner panels and the outer foils. Holes are now drilled on the laminated multi-layer board, including holes for mounting electrical components inserted into the board ("mounting holes"), and holes for making contacts from one layer to one or more other layers (feed-throughs, also called vias or conductive vias). The holes typically are plated through. Each side of the multi-layer panel now is sensitized, then exposed and processed to form the two outer printed circuits in exactly the same manner as forming circuits on the inner panels. New technology for making PCB panels like SBU (sequential build up) or direct ablation of the copper can be used with direct imaging technology. Since a multi-layer panel is exposed in the same way as an inner PCB panel, the words "PCB panel" or simply panel will mean either a complete PCB board, an inner PCB panel, or a post-lamination multi-layer panel.

One difficulty in producing multi-layered printed circuit boards is the strict requirement for accuracy in positioning the different PCB panels together to ensure that the different circuits are positioned very accurately relative to each other. In particular, the mounting holes and vias need to be very accurately placed on each layer's circuits. For a particular tolerance for the placement of a circuit, it is clear that any deviations in the specified location of the circuits on each of the layers may be additive, so that at any one location, there could be large deviations. For the case of double-sided panels, including the multi-layer panel after lamination, it is even more difficult to position the circuits accurately enough relative to each other.

Also for the new technology such as the SBU, where each new layer is directly added to the previous stack of layers as an additive process, the relationship between imaging process and the registration process becomes very critical. The relationship between imaging process and the registration process becomes increasingly critical as increased geometrical accuracy and increased PCB layout density is desired.

A common method for producing printed circuit boards is to first produce artwork, which is an accurately scaled configuration used to produce a master pattern of a printed circuit, and is generally prepared at an enlarged scale using various width tapes and special shapes to represent conductors. The items of artwork, once reduced, for example, by a camera onto film to the correct final size, are referred to as phototools and are used as masks for exposing the sensitized layers. Because the photographic reduction is never 100 percent accurate, more accurate phototools are produced nowadays using photoplotters rather than photographic reduction. However produced, physical phototools are susceptible to damage. In addition, whenever any amendments need to be made to any circuit, new phototools need to be produced. Furthermore phototools, sometimes in the form of photographic negatives, are difficult to store. They also may not be stable; their characteristics might change with temperature and humidity changes and can suffer degraded quality over time.

There thus are advantages to directly imaging the required circuit patterns onto PCB panels, for example PCB panels that include a light-sensitive layer on one or both sides. The same advantage also is applicable to directly imaging printing plates that include a UV, visible light, or thermally-sensitive layer. Often such sensitive sheets as used for PCBs or thermal printing plates are rigid, so that the scanning apparatus for exposing such sheets for direct imaging (e.g., directly exposing printing plates or directly exposing PCB panels) is of the flat-bed type in which the sheet is disposed on a horizontal table for exposure by the light energy (e.g., UV light or infrared) produced by the scanner. Such scanning apparatuses are typically quite bulky because of the horizontal table. Also, such direct imaging systems expose one side at a time, and there are problems accurately aligning the two sides for double-sided exposure.

Direct imaging addresses some of the production issues such as the difficulties associated with photoplotters, phototools, and the image transfer process. Direct imaging, however, does not ensure proper alignment of the PCB panel to be processed, especially with outer layers where the image has to match the drilled holes pattern. Further, direct imaging, alone, does not address the handling of the PCB panels. Modem PCB panel can be large scales such as up to 24 inches in width and up to 36 inches in length (609.6 mm×914.4 mm) or even larger PCB panels are know to be used.

The manufacturing difficulties of precise alignment and handling described above are further amplified as the overall physical size of the PCB panel increases. In many specialized applications the PCB panel can be large scale PCB panels as large as 24 inches in width and 36 inches in length (609.6 mm×914.4 mm) or even larger. The large scale sizes are more difficult to handle and accurately align for processing than more typical, smaller PCB panels. The result is a very slow, complicated and expensive production process that typically results in inconsistent product quality.

Thus there is a need for an automated method for precisely handling, aligning, for example, a drilled holes pattern, and direct imaging both sides of large scale PCB panels to produce a consistently high quality product for a low cost and at a high rate of production. Further, such a process should include the capability of handling large as well as small size PCB panels. Also, mixing panels of varying sizes and thicknesses to be imaged can happen dynamically and automatically without operator input or introducing unnecessary delays and provides the operator with total production flexibility.

SUMMARY OF THE INVENTION

The present invention provides an automated, flow-through, dual side, laser direct imaging process and apparatus. This provides the capability to simultaneously image both sides of a substrate in a continuous flow-through process. The present invention provides efficiency and flexibility improvements over the prior art on several levels. First, the prior art is a batch-based process in which substrates are imaged one (or a batch) at a time in contrast where the present invention is a continuous, flow through, sequential process whereby a first substrate is followed into the apparatus by a second substrate which is, in turn followed by a third and so forth and the second substrate begins the process through the apparatus before the first substrate completes the process through the apparatus, substantially reducing or even eliminating handling process time. Second, the process time per substrate is reduced as compared to the prior art. Third, different panel sizes and thickness can be mixed according operator needs without introducing additional handling process time which provides the operator with total production flexibility.

The present invention discloses a method for automated direct imaging of a sensitized panel. First, a panel is loaded to a registration station and registering the panel. Then imaging at least one of a front surface and a back surface of the panel utilizing a direct imaging station. Then unloading the panel. The process occurs automatically in sequence without operator intervention. Additional panels can be handled and processed automatically.

The present invention describes an apparatus for automated direct imaging of a sensitized panel. The apparatus includes a loading station mounted on a floor surface, a registering station which is detachably docked to a loading station and an imaging station, and an unloading station mounted on a floor surface. A sensitized panel can be loaded in said loading station, and then moved to said registering station, and then registered in said registering station, and then imaged in said imaging station, and then unloaded at said unloading station.

BRIEF DESCRIPTION OF THE FIGURES

FIGS. 5A–5B illustrate one embodiment of the panel flipper 500 in accordance with the present invention.

FIGS. 9A–9B illustrates one embodiment of the exposing carriage carrying a panel through the dual side imager, in accordance with the present invention and shows the unload system.

DETAILED DESCRIPTION OF THE INVENTION

Figure 1:
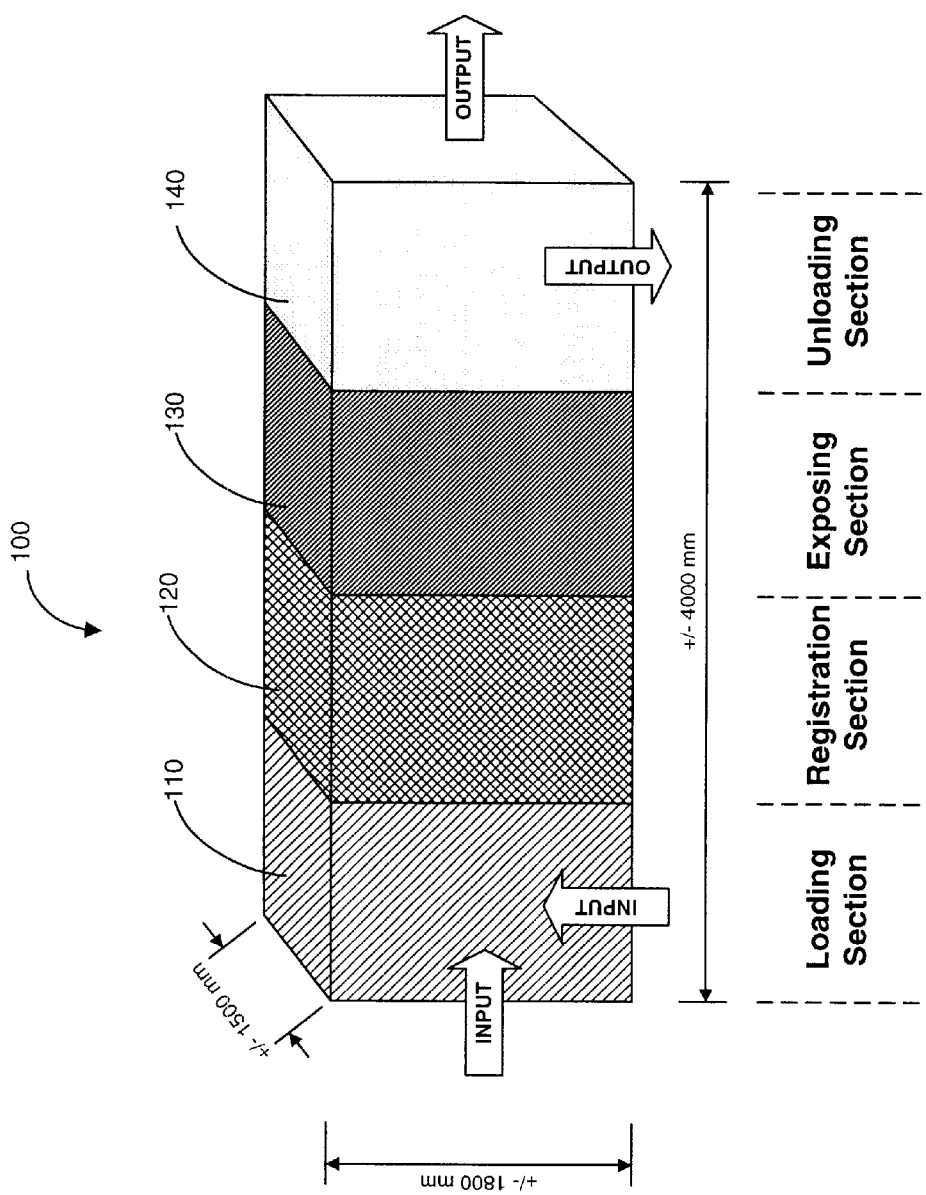
FIG. 1 illustrates a modular view of one embodiment of the present invention 100.

FIG. 1 illustrates a modular view of one embodiment of the present invention 100. The modules include a loading module 110, a registration module 120, an exposing or imaging module 130 and an unloading module 140. Both the process and apparatus of each respective module will be more fully described below. An overview of the process of the present invention includes first loading a sensitized panel or substrate, then aligning or registering the panel in the system, then imaging or exposing the panel, and finally unloading the panel from the present invention.

The process through the first embodiment begins with loading a first panel. The loading zone 110 includes different actions and phases with multi-tasking capabilities. The main function is to accept a panel and to move the panel to the next zone, in this case a registration zone 120. In an alternative embodiment, the panel is pre-registered in the loading zone. In a preferred embodiment, the complete loading zone 110 can be removed or separated from the other portions of the present invention to ease shipment, installation and service.

The interface to between the outside world and the loading zone 110 can be fully automated or manual. In an automated embodiment, the connection with the previous process is accomplished using a conveyor, a robot or other equivalent automated methods. In an alternative embodiment, simple electrical signals such as input ready, input busy or input jam can be linked to the previous process making the system to work in a closed loop. Other control and status data can also be communicated to other previous processes, subsequent processes and remote monitoring and or control systems. In a manual embodiment an operator manually places the panel in the loading zone. In an alternative embodiment, the present invention can accept panels input from at least two directions: i.e. from the side or from the front of the loading zone. Other directions such as vertically loaded panels or from the rear of the apparatus can also be accommodated in still other embodiments. Accepting input from multiple directions provides increased flexibility and compatibility with the prior processes. In one embodiment, one input direction could be automated and provide the other inputs available for manual operation. The preferred embodiment can also include sensors to automatically detect which direction a panel is input from. In such an embodiment, the sensors can be utilized to disable any other input direction when the first input direction is utilized. Such sensors may be infra red or other light sensors or may also be weight or motion sensors.

In an alternative embodiment, a panel cleaning device can be added immediately preceding the loading zone. Panel cleaning devices are utilized to remove contamination such as dust, grit, fibers, hair, machinery debris, insects, etc that are larger than 1 micron or even smaller. Such panel cleaning devices are widely available such as the Clean Machine from Teknek Electronics Ltd. River Drive, Inchinnan Business Park, Renfrewshire, PA4 9RT, Scotland, UK or similar cleaning devices. In still another alternative embodiment, the cleaning devices could be located in other locations in the process and apparatus as long as they are used before the imaging process.

In yet another embodiment, the entire process apparatus may be contained within a controlled environment such as a Class 1000 environment or better. As is well known to those skilled in the art, a Class 1000 environment controls the amount of contamination in the ambient air surrounding the process. A cleaner, controlled environment results in a more accurate, repeatable imaging process as any contaminants can interfere with the imaging process. Different methods to enclose the process and apparatus in a Class 1000 or better clean environment include housing the process apparatus in a Class 1000 clean-room or in a self-contained microenvironment. Such micro-environments are widely available from various sources. Examples include various products and systems from Clean Air Technology of Canton, Mich., USA or Clean Air Products of Minneapolis, Minn.

In yet another embodiment, additional modules can be placed in front of the input slot. One such device can read bar codes. If the panels to be exposed are labeled with a bar code, this bar code reader device could get information about size and material properties of the panel to be exposed. This could than be used to automatically retrieve the correct image data from a server such as a raster imaging processor (RIP). Such an embodiment reduces errors such as size mismatches between image data size and panel size which can happen easily when processing various panel sizes. Also, such a bar code reader can reduce the operator effort to operate the machine since the operator now must only observe the panel supply towards the processing apparatus.

Optionally, the panel can next be pre-registered. In pre-registering, the panel is mechanically aligned to a reference point on the loading table. Pre-registration accuracy in the range of 1 mm can be achieved easily in a very short cycle time. The panel is moved mechanically such as by sliding across the loading table or by tilting the loading table, toward the zero position. The panel is aligned by three pins using the sides of the panel. A zero position detector will check if the panel is pre-registered correctly or not. The big advantage in doing a pre-registration is that less time is required during the final, fine registration process because the positional error is already substantially reduced. Pre-registration can thereby decrease the total throughput time.

Next, the panel is picked-up and rotated from a horizontal position to a vertical position. This is accomplished by rotating a pick-up mechanism to near the panel level. One embodiment of the pick-up includes a set of grippers to hold the panel at the edges. Other methods such as vacuum caps or a vacuum table may also be utilized to hold the panel during rotation. See for example, U.S. patent application Ser. No. 09/447,184 to Vernackt filed Nov. 22, 1999, entitled AUTOMATICALLY ADAPTING VACUUM HOLDER, and assigned to the assignee of the present invention, for an example of a vacuum table that may be used in the present invention. An advantage of using grippers is that the chance of dropping the panel during rotation and moving is significantly reduced. Also when the panel is transferred to the registration system, the panel must be gripped by a second gripper system or a vacuum table. Grippers use only a small portion of the panel. After closing the grippers, the pick-up mechanism and the panel are rotated from a horizontal to a vertical position. The bottom load plate can also rotate to help the panel being rotated to avoid being bent. The panel then hangs vertically. The bottom plate then returns to the horizontal position. The loading zone 110 is then free and both inputs are cleared, ready to accept the next panel. As the first panel is moved to the registration zone 120 or section, a second panel can be loaded in the load zone 110. Each of the different portions of the loading process, happen fully independently and thus in parallel with other actions of the present invention. Approximately 20 seconds are required to complete the load/pre-registration process on the panel.

Now that the first panel is in the registration zone 120, the panel must be registered. Registration is a multi-step process. First, the panel is rotated slightly so that the vertical line between two reference points at top and bottom of the panel are parallel to the scan line. Typically, three reference points or targets are used to determine the X-Y scale factor and the delta theta rotation error. Delta theta rotation error is the change in rotation required to cause the two reference points forming a vertical line on the panel to be parallel to the scan line of the imaging section. The delta theta rotation error correction can be accomplished mechanically by rotating the vacuum plate or grippers holding the panel using a motor with a gearbox or eccentric systems or using piezo devices in the grippers to achieve highly accurate positions. During this rotation, a vision system checks the position of at least two targets on the panel and forms a closed loop with the driver or controller of the motor. Next, the two scale factors in X and Y direction are searched using at least three targets. The three targets are typically located in a L-shape along the long and short side of the panel. Using a grid system and a dynamic range vision system, the registration phase can happen very quickly and gives total location freedom of the targets to be inspected. Also the number of targets in this case to be checked does not matter for the system. In an alternative embodiment, both surfaces of the panel can be registered as described above. If both surfaces are registered then any alignment error existing between the two surfaces can be determined and appropriate correction data can be sent to the imaging section so that the alignment errors are corrected for during the imaging process.

Next, the panel is attached to the exposing carriage using grippers or an equivalent holding device such as a vacuum or other holding devices. Once the grippers of the exposing carriage have closed on the panel, the registration zone 120 is reset to accept the next panel for registration. At this point the relative position of the panel to the grippers of the exposing carriage is known. This relative position information can be utilized in the imaging process to correct or adjust the imaging process.

The exposing carriage then transports the panel through the imaging zone 130 or section. In the imaging zone 130, a dual sided, laser, direct imager exposes both sides of the panel simultaneously as the exposing carriage moves the panel very accurately using a high resolution linear encoder or other similar devices known in the art. The direct imaging or scanning process is the dominating process and depends on many variables such as available laser power, resolution, resist sensitivity, etc. Before the scanning begins, the optical scanning heads are brought in close proximity to the panel. The panel hangs vertically, so that the panel's weight helps maintain the straight, vertical orientation of the panel. A pair of guides below the optical heads, establish an air bearing on either side of the panel. The guides and resulting air bearing enable a very precise vertical position of the panel. The scanning begins at the front edge of the panel and continues in a vertical line as the panel progresses horizontally. In short, the imager scans up and down and the panel movement provides the horizontal movement necessary to scan or image the entire surfaces of the panel. See above mentioned U.S. patent application Ser. No. 09/435,983 for a description of one embodiment of an imaging apparatus and process suitable for the present invention. In alternative embodiments of the present invention, other dual side direct imaging processes can also be utilized.

When the last scan line is set onto the panel, the grippers mounted on the exposing carriage will open. The panel then falls downwards in a controlled manner to be picked up by the unloading section 140 or zone. Similar to the loading section 110 or zone, the unloading section 140 or zone can include sensors to sense the presence of a panel. The unloading section 140 can also be automatic or manual in interface with any subsequent processes. Also similar to the loading zone 110, the unloading zone 140 can include the capability for unloading to subsequent processes in a plurality of directions. Also similar to the loading zone 110, one exit slot can be automated while the others can be used for manual uses. Also similar to the loading zone 110, the complete unloading zone 140 can be removed or separated from the other portions of the present invention to ease shipment, installation and service.

During operation in continuous full, flow through mode, i.e. most efficient manner, three panels are in process at any one time. Each panel will have a different action. Each of the sub processes: loading, registering, imaging and unloading are operating fully independent and that the overall system is in multi-tasking mode. In the preferred embodiment, the logic is controlled via an embedded computer (PC), running control software. In other alternative embodiments other types of controllers such as sequential logic controllers, PLCs and other controllers may also be used.

One embodiment of the present invention may be operated in three types of integration of this principle: fully automated, semi-automated and manual. Fully automated means that automated input and output via a conveyor or robots or equivalents thereof and panels are delivered to the input in an automated manner and the panels output are removed from the unload section in an automated manner. Semi-automated means that the panels are delivered manually for input and removed from the unload section manually, but inside the process the panel handling is accomplished fully automatically, using the loading and unloading sections. Manual operation means operation without the loading and unloading sections. In manual operation, panels are manually "loaded" directly into the registration section and removed from the output of the imaging section.

Figure 2:
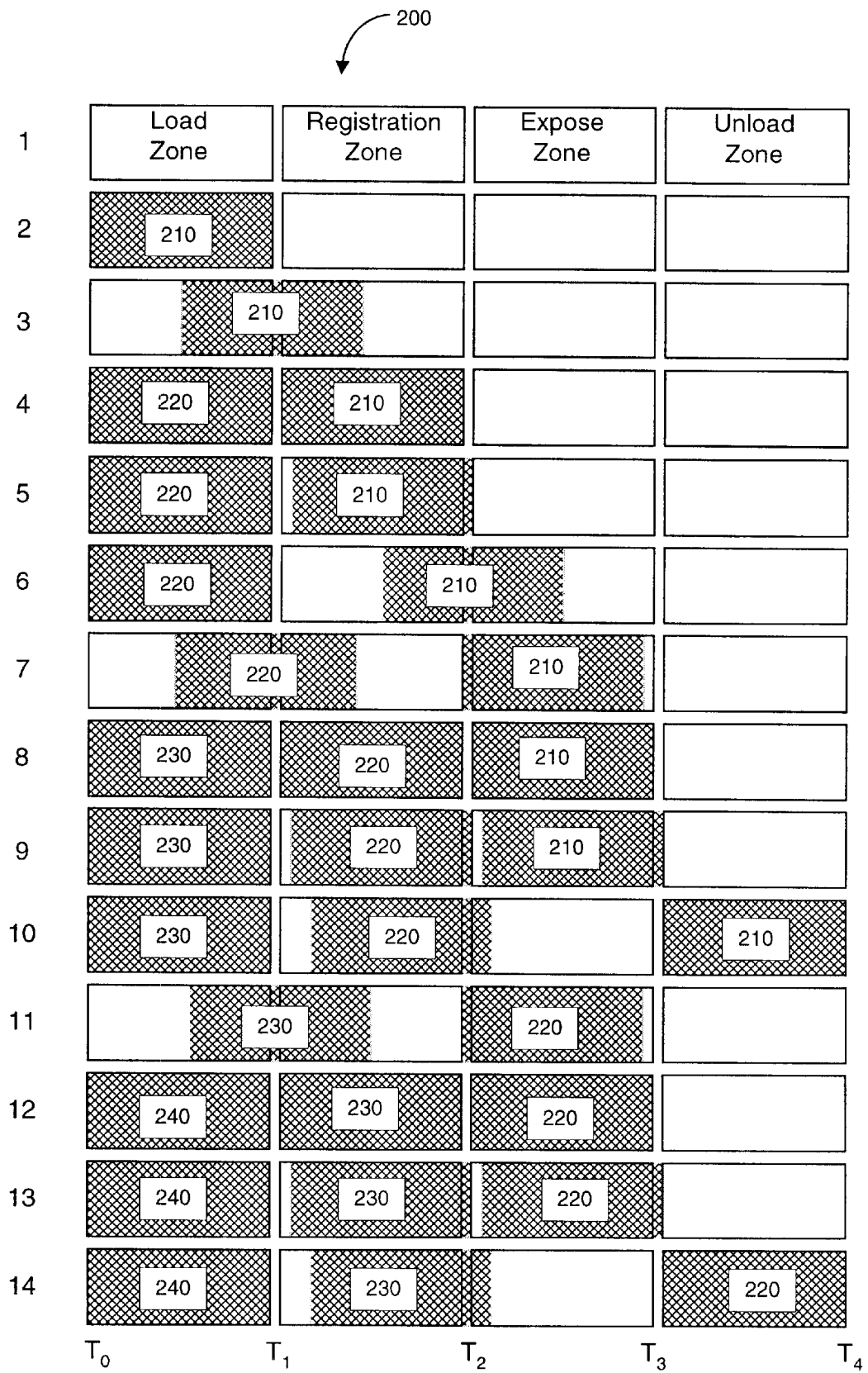
FIG. 2 illustrates the parallel processing 200 of multiple panels through the one embodiment of the present invention.

FIG. 2 illustrates the parallel processing 200 of multiple panels through the one embodiment of the present invention. FIG. 2 is divided by lines 1 to 14. Lines 1 to 14 are divided into four columns designated by their respective headings: Load Zone, Registration Zone, Expose Zone and Unload Zone. FIG. 2 also includes timing points of the process designated $T_0$, $T_1$, $T_2$, $T_3$ and $T_4$, respectively. $T_0$ represents the start time of the process on a first panel 210. $T_1$ represents the completion time of loading the first panel 210. $T_2$ represents the completion time of registering the first panel 210. $T_3$ represents the completion time of exposing or imaging the first panel 210. $T_4$ represents the completion time of unloading the first panel 210. The present invention is capable of handling various sizes of panels through the process. Examples of some of the various panel sizes and the timing, expressed in seconds, in processing the panels through one embodiment of the present invention are included in Table 1.

TABLE 1

| Timing Point | 36 Inch Panel* | 18 Inch Panel* | 32 Inch Panel* |
| --- | --- | --- | --- |
| $T_0$ | 0 | 0 | 0 |
| $T_1$ | 10 | 10 | 10 |
| $T_2$ | 20 | 20 | 20 |
| $T_3$ | 65 | 45 | 61 |
| $T_4$ | 75 | 55 | 71 |

*Time expressed in seconds

FIG. 2 also illustrates at least a portion of the processing of subsequent panels 220, 230 and 240 through the present invention. In one embodiment, the present invention can process panels ranging in dimensions within the range of 9 inches to 24 inches in width and 12 inches to 32 inches in length and 50 $\mu$m to 6 mm in thickness.

Figure 3:
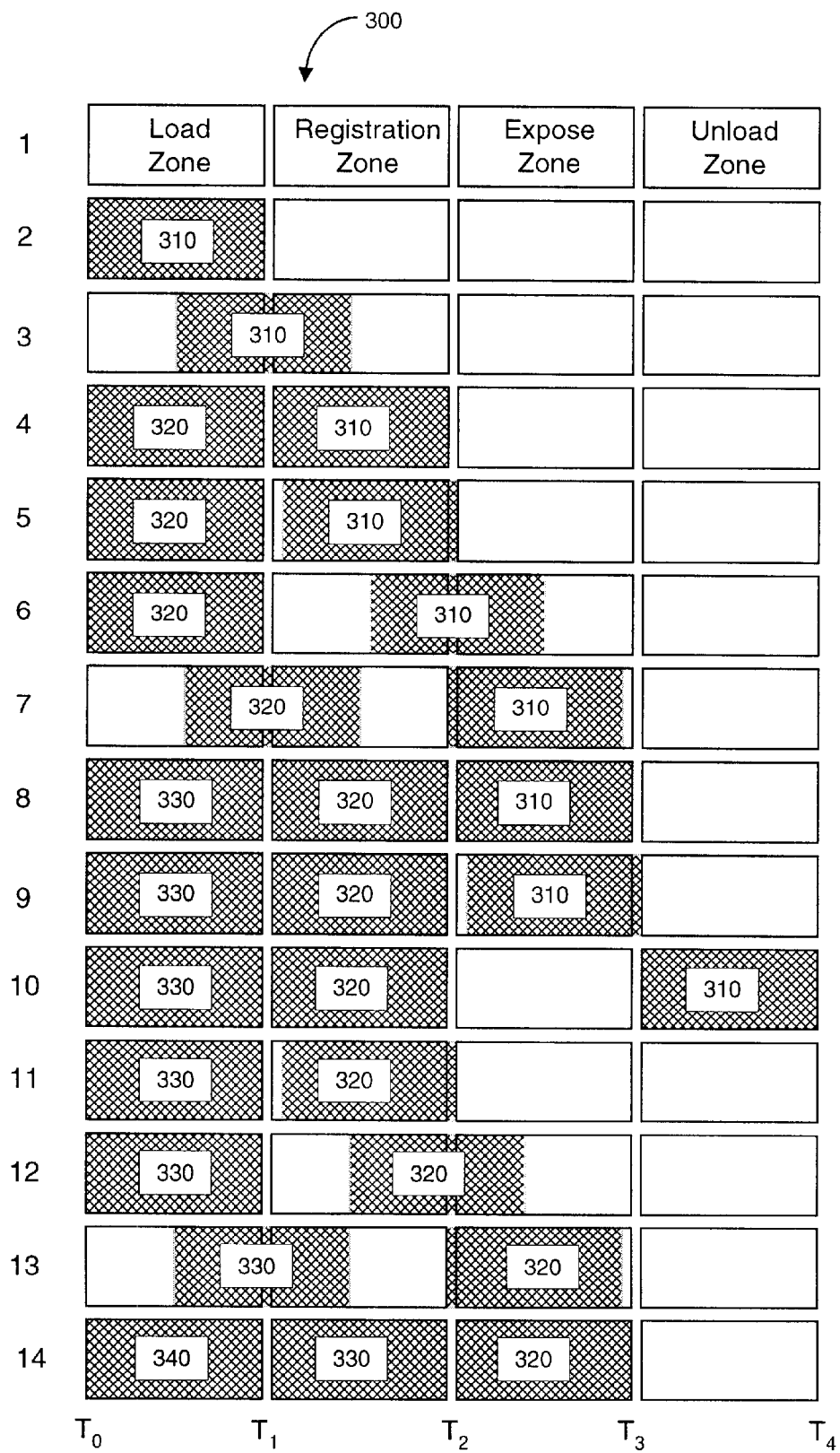
FIG. 3 illustrates the sequentially processing 300 of multiple panels through the one embodiment of the present invention.

FIG. 3 illustrates another embodiment 300 of the present invention where the panels 310, 320, 330, 340 are processed sequentially rather than parallel as shown in FIG. 2. Sequential processing may be preferred for certain applications but results in a somewhat slower process time for the subsequent panels 320, 330, 340. As is clearly shown panel 340 is not loaded until line 14 in sequential processing, FIG. 3 as compared to panel 240 loaded at line 12 in parallel processing, FIG. 2.

Figure 4A:
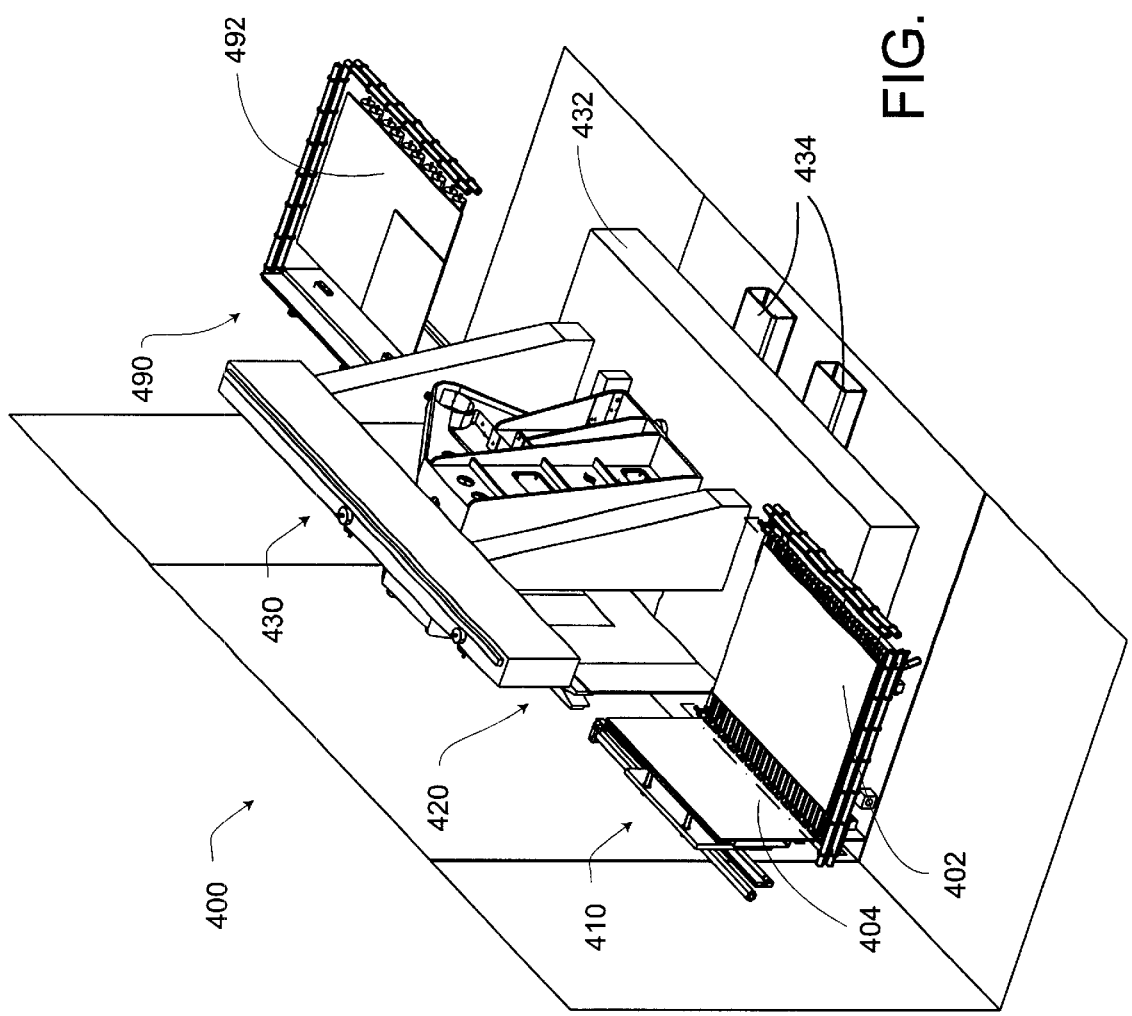
FIG. 4A illustrates an isometric view of one embodiment 400 of the present invention.

FIG. 4A illustrates an isometric view of one embodiment 400 of the present invention. The loading zone 410 is shown in the foreground and includes the loading table 401 and the panel flipper 404. The registration section 420, is not shown but the location is as shown. The imaging section 430 is shown in the center of the FIG. 4A. The unloading section 490 includes an unloading table 492. The foundation slab 432 and the foundation slab forklift openings 434 of the image section 430 are also shown.

Figure 4B:
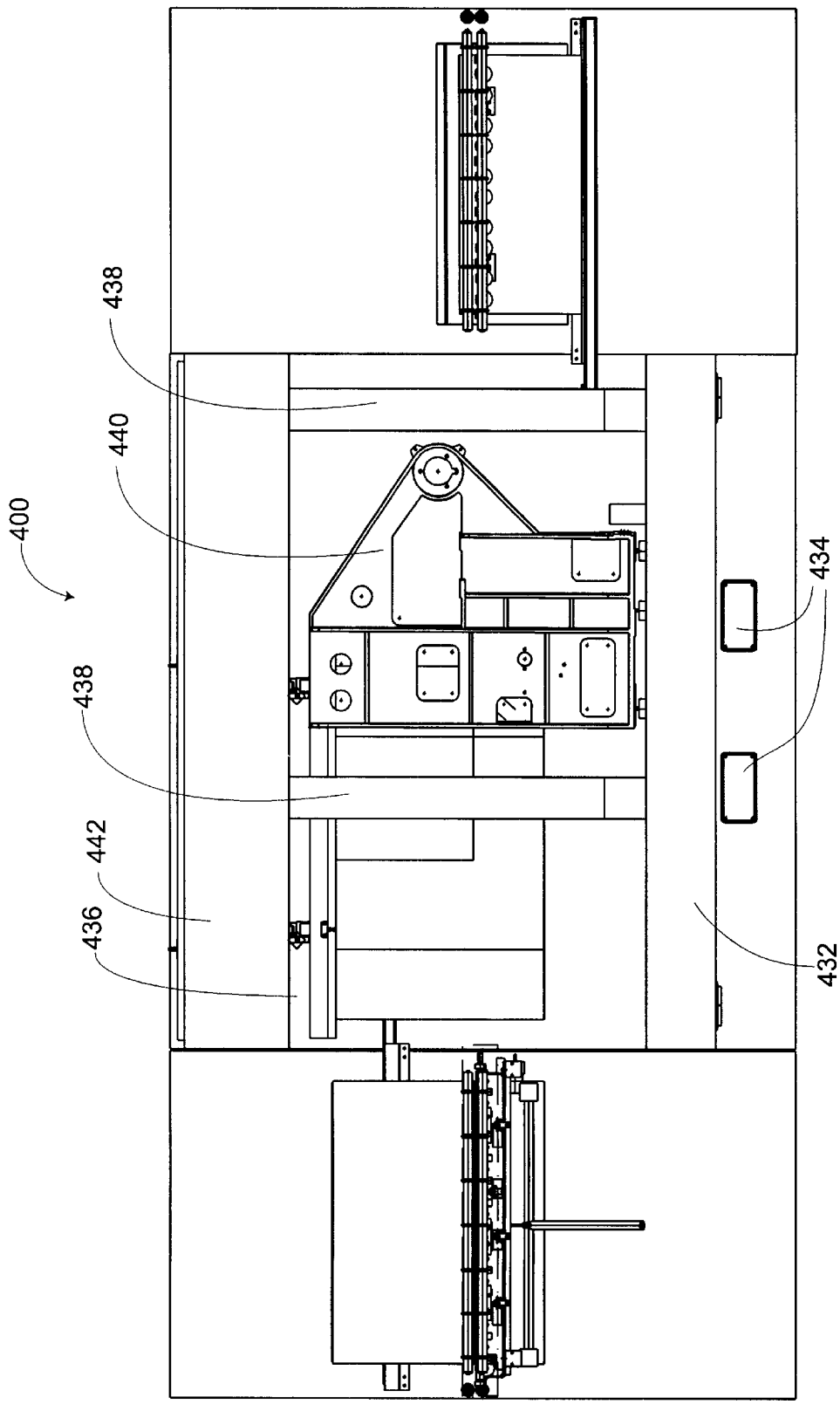
FIG. 4B illustrates a front view of one embodiment 400 of the present invention.
Figure 4C:
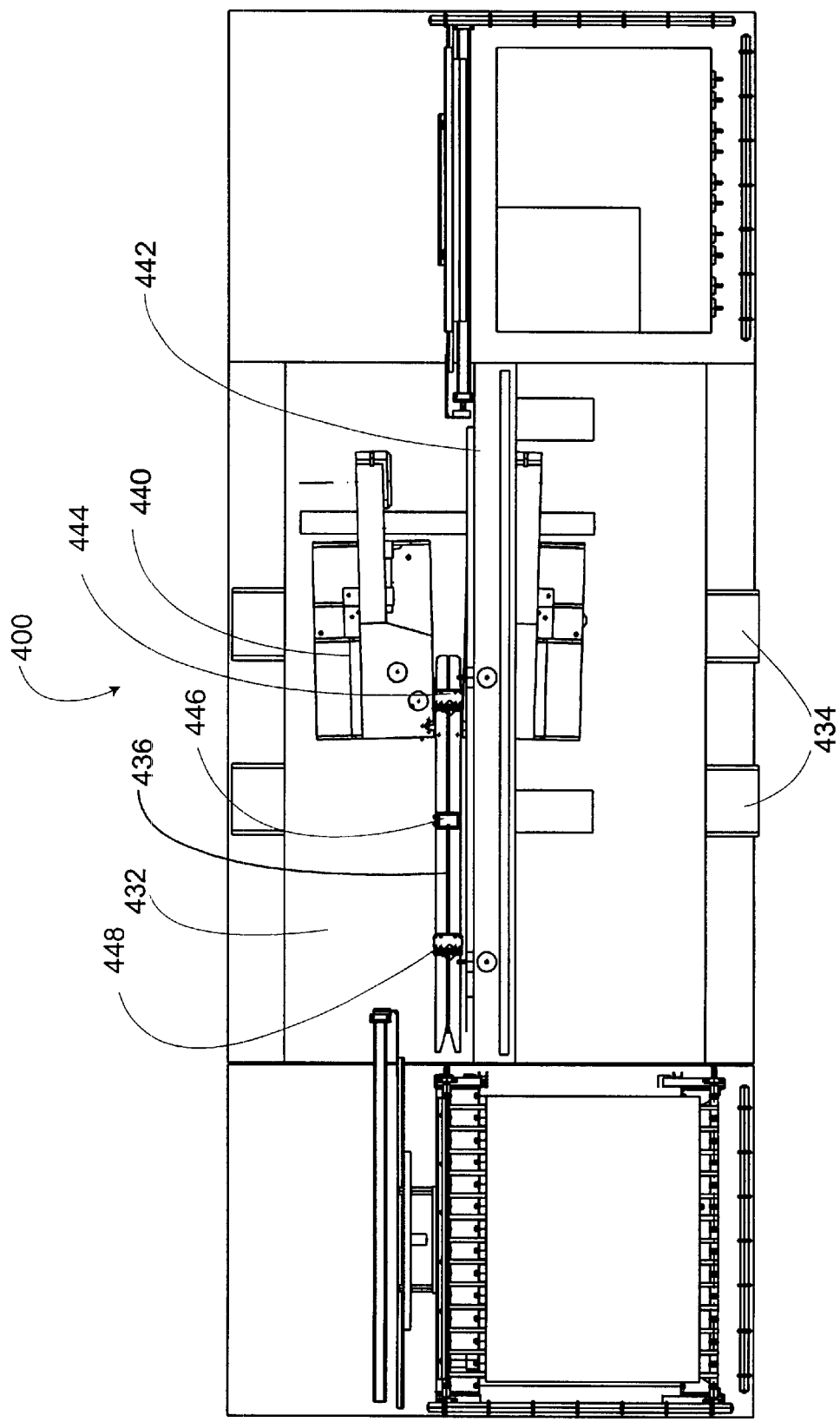
FIG. 4C illustrates a top view of one embodiment 400 of the present invention.

FIG. 4B illustrates a front view of one embodiment 400 of the present invention. The exposing carriage 436, vertical supports 438, imager 440, foundation slab 432 and top rail 442 are shown. The foundation slab 432, vertical supports 438 and top rail 442 are manufactured from a very stable material. The registration section 420 is not shown in FIG. 4B. FIG. 4C illustrates a top view of one embodiment 400 of the present invention. The exposing carriage grippers or clamps 444, 446, 448 imager 440 and top rail 442 are shown. The registration section 420 is not shown in FIG. 4C.

Figure 4D:
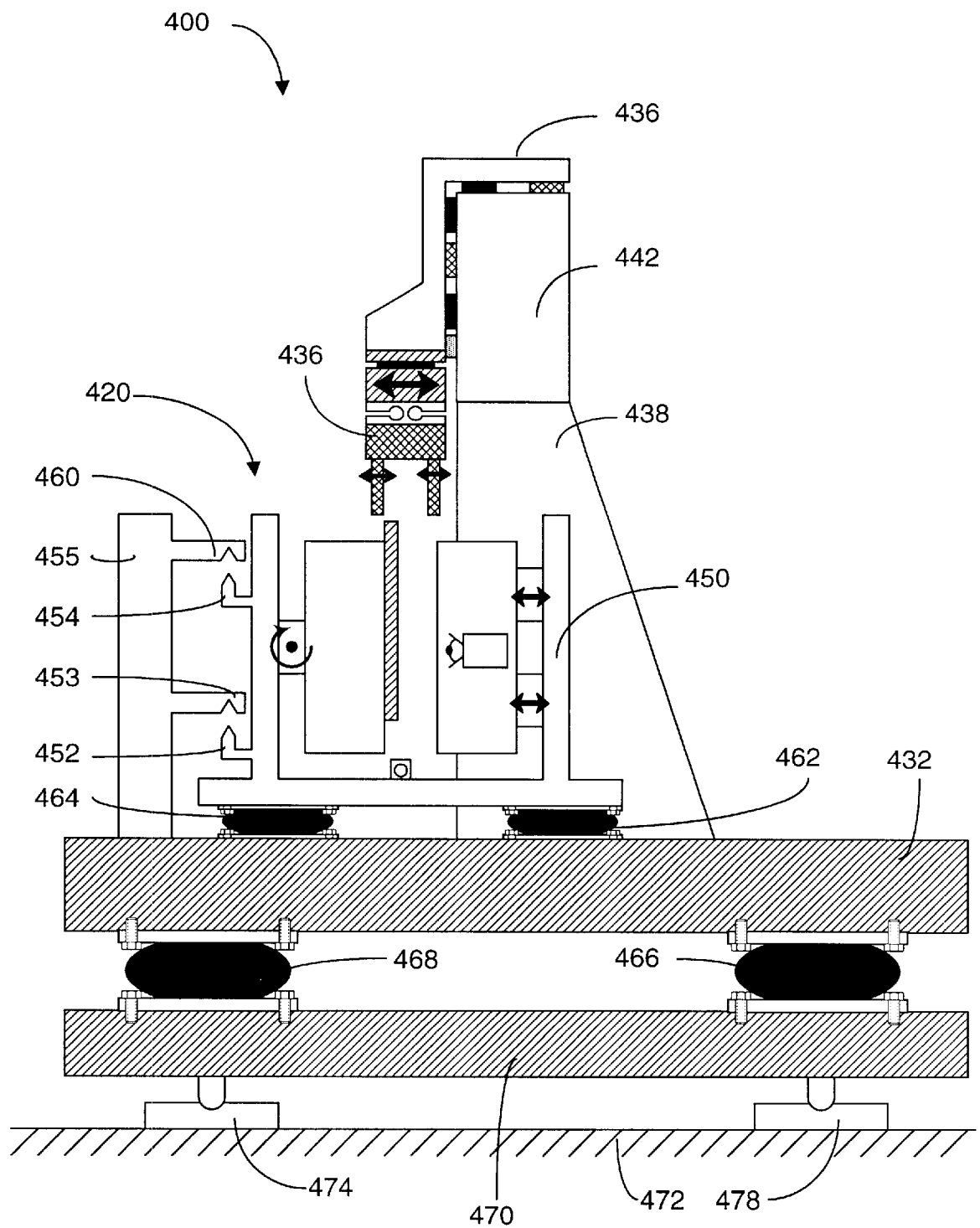
FIG. 4D illustrates a side view of one embodiment 400 of the present invention.

FIG. 4D illustrates a side view of one embodiment of the present invention showing the registration section 420, which includes the registration sub frame 450, tapered guide pins 452, 454 and guide pin sockets 453, 455 which are mounted to the registration mount 460 which is securely fastened to the foundation slab 432. Between the registration sub frame 450 and foundation slab 432, vibration isolators 462, 464 are installed. The isolators can be air bellows or other viscous couplings capable of isolating the registration sub frame 450 from the foundation slab 432. Such viscous couplings can include oil or water filled couplings or combinations thereof or any equivalents thereof. Additional vibration isolators 466, 468 are installed between the foundation slab 432 and the base 470. The base 470 is mounted via legs 474, 478 to the floor surface 472. The isolators 466, 468 are operable to isolate the from the foundation slab 432 from vibrations in the floor surface 472 or other portions of the outside world such as the loading 410 and unloading 490 sections. Isolating the foundation slab 432 and thereby isolating the imager 440 installed on the foundation slab 432 is extremely critical toward maintaining accuracy of the scanning and imaging. The foundation slab 432, vertical supports 438 and top rail 442 can be manufactured from any large, stiff and massive material. Examples include granite, steel or other equivalently massive and stiff material. In a preferred embodiment, the foundation slab 432 is at least 3000 kg. This heavy weight ensures us a very stable construction where the impact of external vibrations is reduced to a minimum. A lighter foundation slab 432 would be more susceptible to external vibrations and there fore less preferred.

Figure 5A:
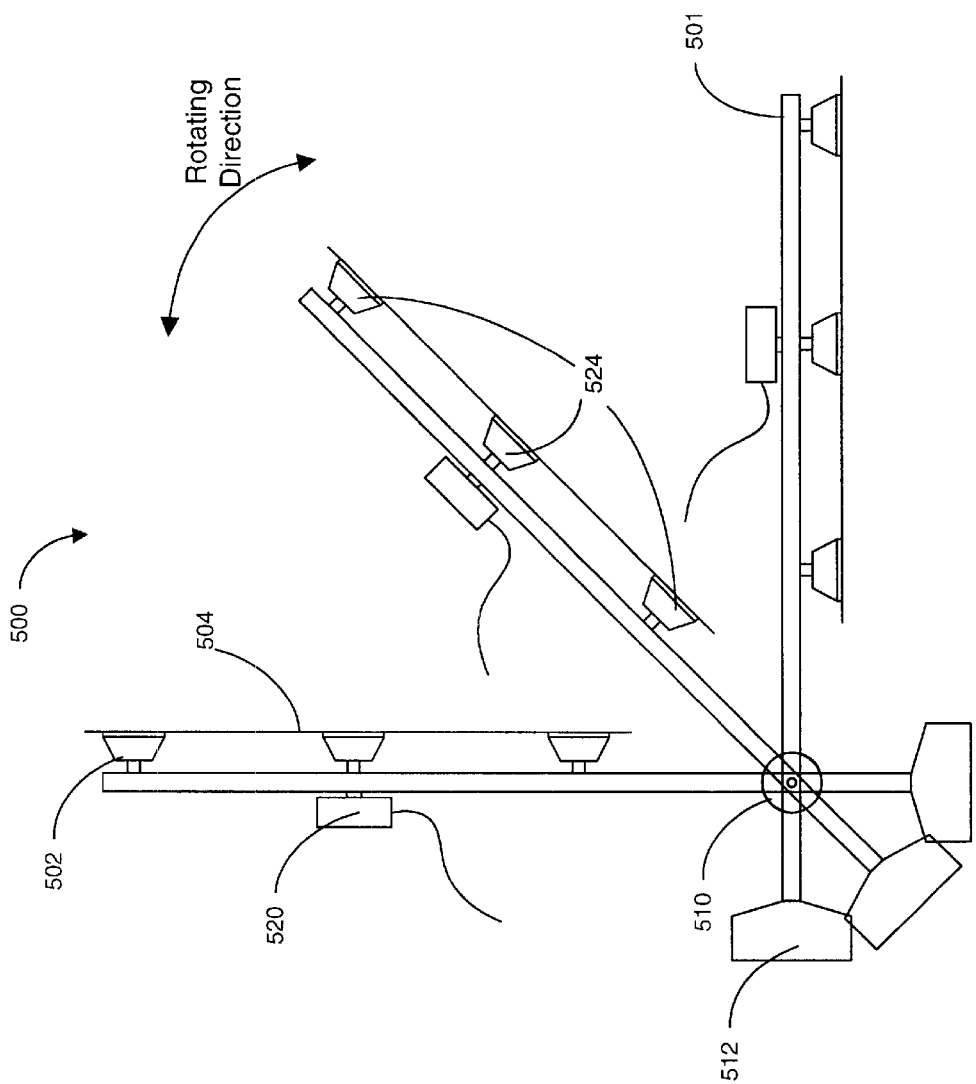

FIG. 5A illustrates one embodiment of the panel flipper 500 in accordance with the present invention. The panel flipper is utilized to rotate the panel to be exposed from horizontal to vertical orientation. The panel flipper 500 includes a frame 501 and a suction cap system 502 for securely holding the panel 504. A vacuum ejector 520 for generating the vacuum in the suction caps system 502 and thereby holding the panel 504. A rotary actuator 510 is also shown. The rotary actuator 510 can also include internal detectors and speed controllers. A counterweight 512 is also included to balance the frame 501 and ease in the movement of the frame 501. The suction caps system 502 can include a plurality of suction caps 524 configured to allow the panel flipper 500 to engage and securely move a plurality panel sizes. A vacuum table system as mentioned in U.S. patent application Ser. No. 09/447,184 can be used in one embodiment. FIG. 5B illustrates the plurality of suction caps 524 arranged in an array configuration. Other arrangements may also be utilized to cover a sufficient portion of the panel 504 to be handled. The vacuum is operable to hold the panel 504 during rotation and so that the panel 504 hangs vertically during movement toward the registration zone.

Figure 6A:
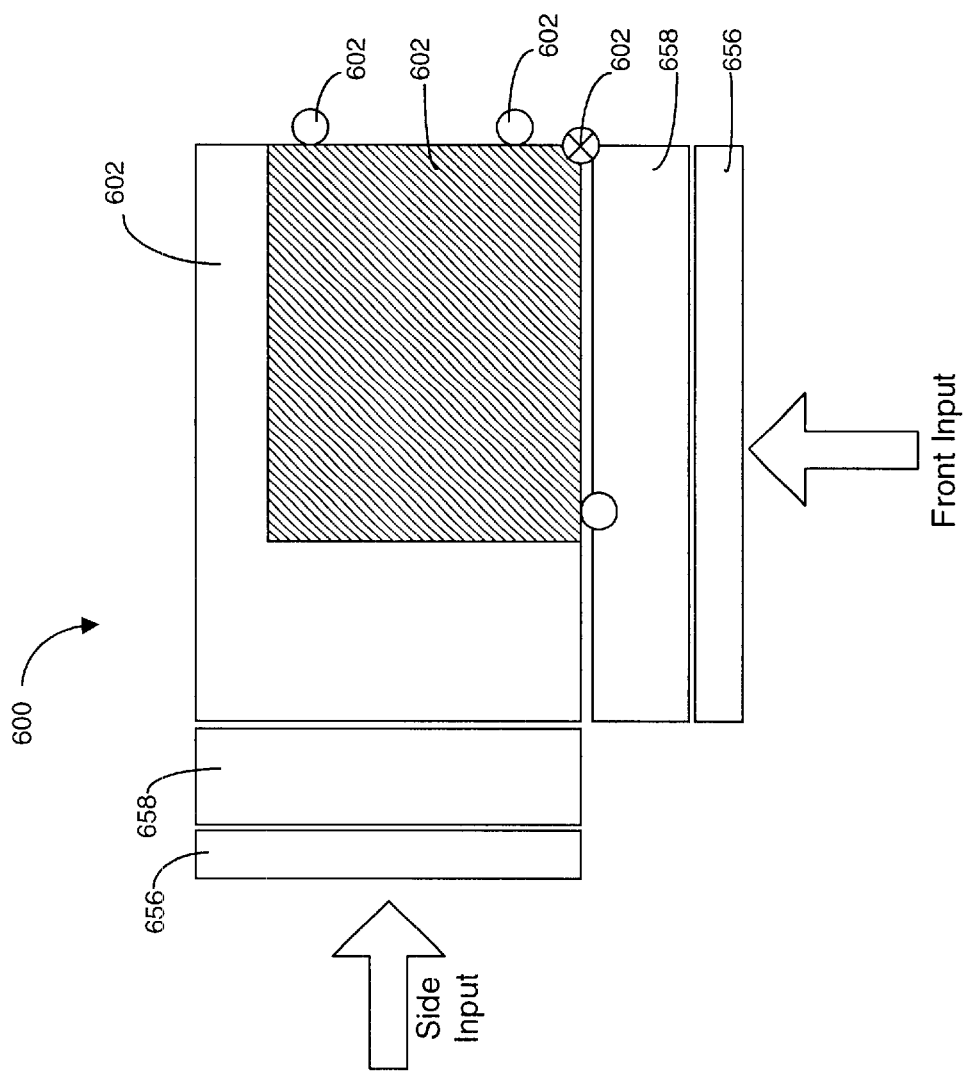
FIGS. 6A–6E illustrate another embodiment of the panel flipper 600 in accordance with the present invention.
Figure 6B:
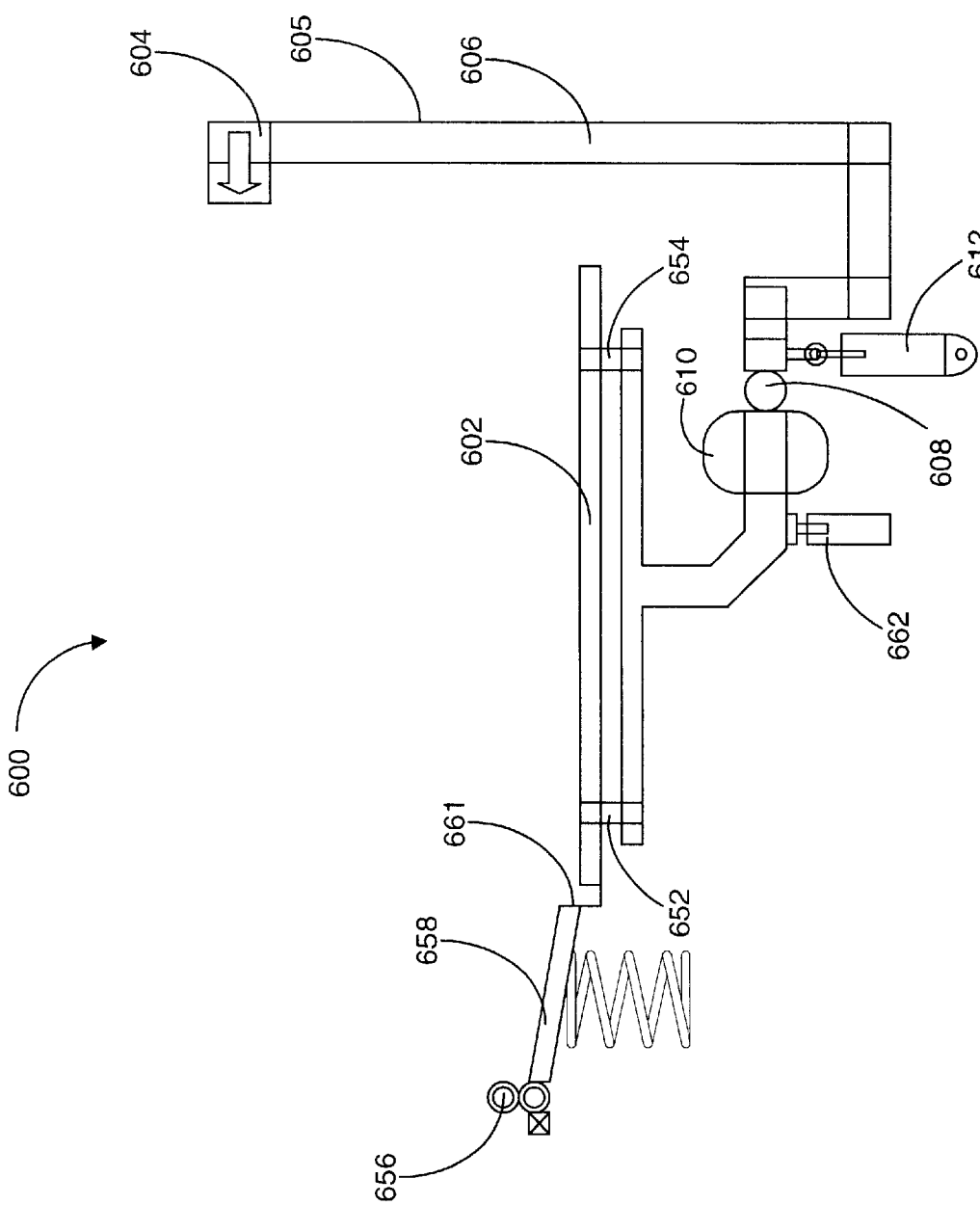

FIG. 6A illustrates a load section 600 in accordance with one embodiment of the present invention. Table 602, panel 603, edge reference pins 662, 664, 666, zero point detector 660, input rollers 656 and transfer ramp 658. The edge of panel 603 is positioned against the three reference pins 662, 664, 666. The zero point detector 660 then checks the panel is properly positioned and touching the reference pins 662, 664, 666. In an alternative embodiment, the reference pins 662, 664, 666 can be a straight zero point edge 661 such as shown in FIG. 6B. FIG. 6B illustrates one embodiment of the loading section 600 and a loading table 602 in accordance with the present invention. The panel flipper 605 includes a plurality of grippers 604 attached to the end of the panel flipper frame 606. A pivot 608, counterweight 610 and actuator 612 are also included. The loading table 602 also includes cylinders 652, 654, input rollers 656 and transfer ramp 658, a zero point edge 661 and a damper 662. Cylinders 652, 654 and two others, which are not shown in this view, are operable to tilt the loading table 602. The surface of the loading table 602 is made from a very low friction material and could also be equipped with a plurality of air jets so that the panel 603 (not shown) slides in a controlled way towards the zero point edge 661.

Figure 6C:
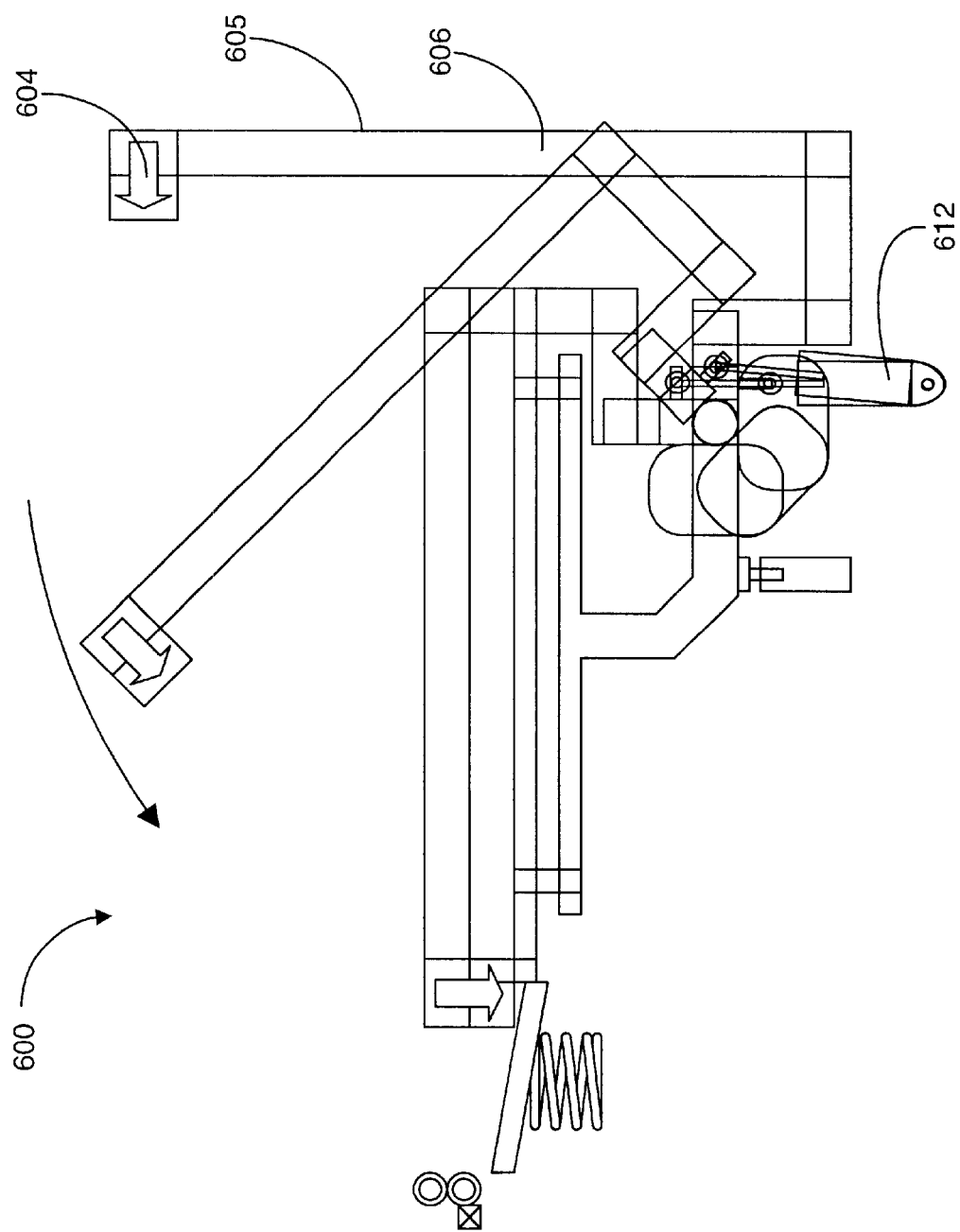
Figure 6D:
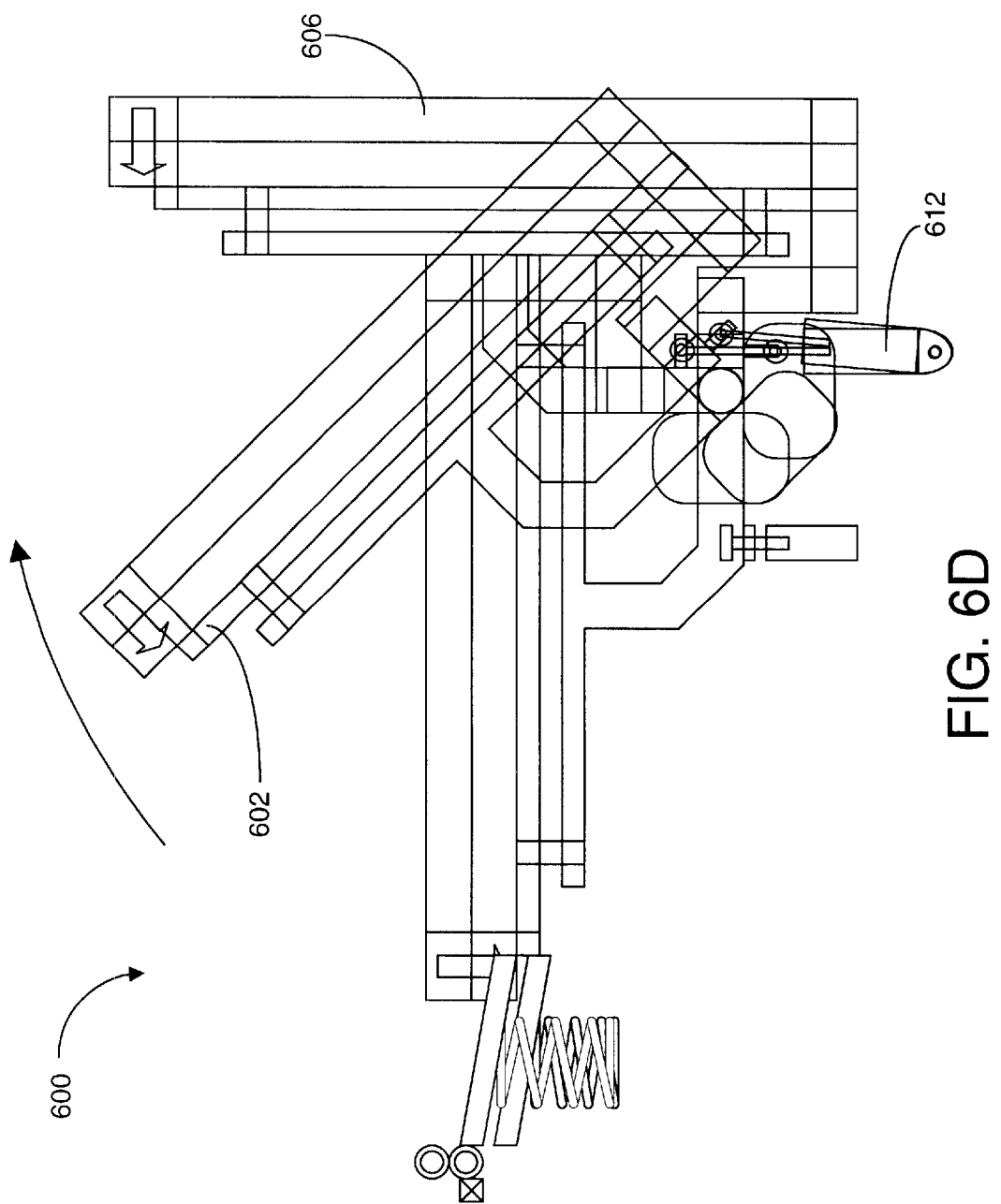
Figure 6E:
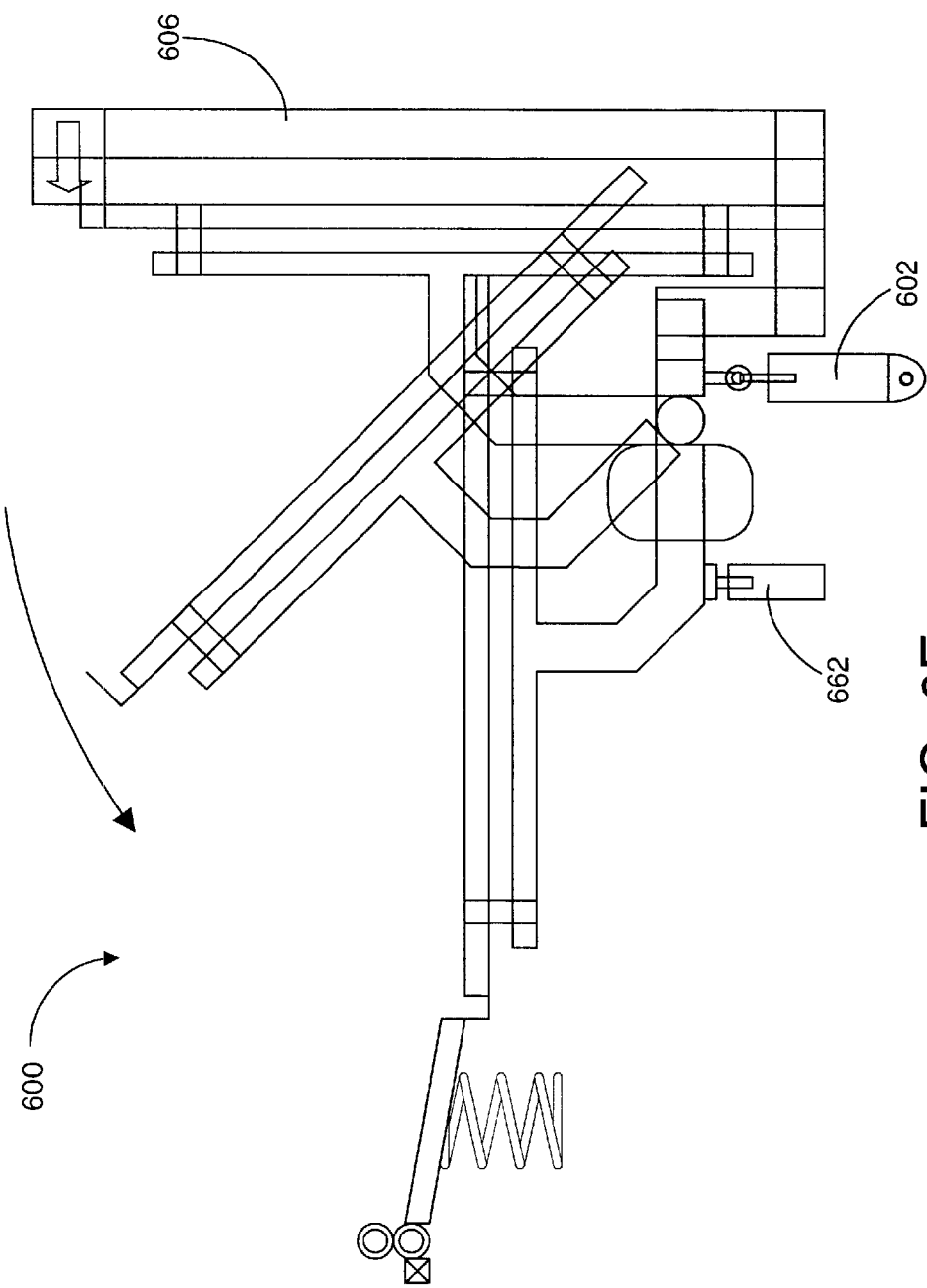

The process of loading a panel is illustrated in FIGS. 6B through 6E. In FIG. 6B a panel enters the loading table 602 through input rollers 656, down the transfer ramp 658 to the loading table 602 surface. Of course other input directions can be used and is not drawn here. The cylinders 652, 654 can then be selectively manipulated to cause the panel to move towards the zero point edge 661. Then, as shown in FIG. 6C, the panel flipper frame 606 rotates around the pivot 608 via the actuator 612, towards the panel 603 (not shown). When the panel flipper frame 606 is in close proximity to the edge of the panel it depresses the transfer ramp 658 to expose the edge of the panel. The grippers 604 are then actuated to securely grab the panel 603 (not shown) and loading table 602. Then, as shown in FIG. 6D, the panel flipper frame 606 rotates around the pivot 608 via the actuator 612, toward the vertical. When the panel flipper frame 606 is rotated vertically, the loading table 602 rotates with the panel flipper frame 606. Rotating the loading table 602 with the panel flipper frame 606 helps the panel during rotation and thereby substantially avoiding bending the panel 603. In FIG. 6E, the loading table 602 rotates back to horizontal orientation. The panel 603 (not shown) can then be transferred to the next process in the vertical orientation. After the loading table 602 is rotated to horizontal the entire loading process can begin for a subsequent panel.

Figure 7:
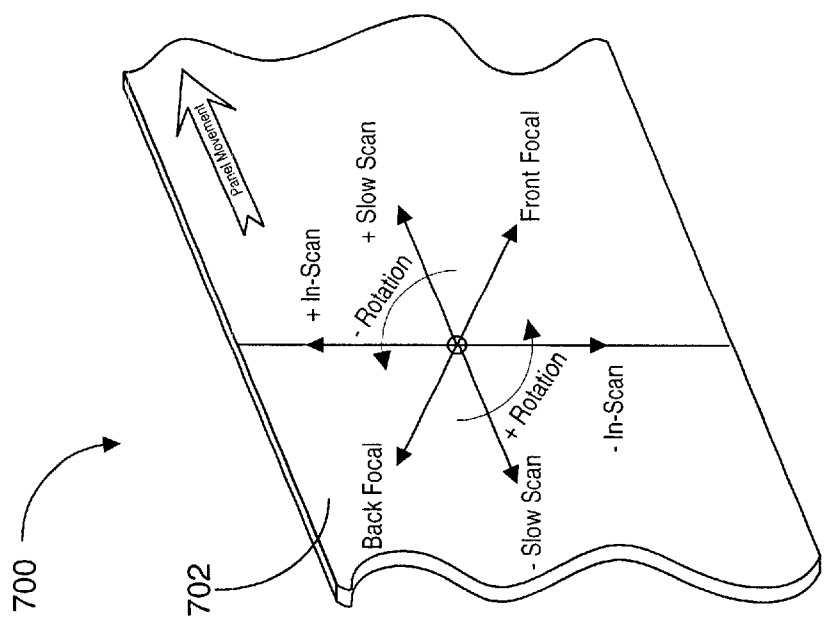
FIG. 7 illustrates the six directions necessary to register a panel 702.

FIG. 7 illustrates the six directions necessary to register a panel 702. Those directions are also very important to get a perfect image quality on the panel. The +In-Scan direction is moving the panel vertically up. The −In-Scan direction is moving the panel vertically down. The +In-Scan and the −In-Scan are along the Y axis of the panel. The +Slow Scan direction is moving the panel horizontally, parallel with the plane of the panel and further towards the unloading section of the present invention. The −Slow Scan direction is moving the panel horizontally, parallel with the plane of the panel and back towards the loading section of the present invention. The +Slow Scan and the −Slow Scan are along the X-axis of the panel. The Front Focal direction is moving the panel horizontally, perpendicular to the panel, towards the front of the present invention. The Back Focal direction is moving the panel horizontally, perpendicular to the panel, towards the back of the present invention. A +rotation and -rotation directions move the panel in order to reduce the delta theta error.

Figure 8A:
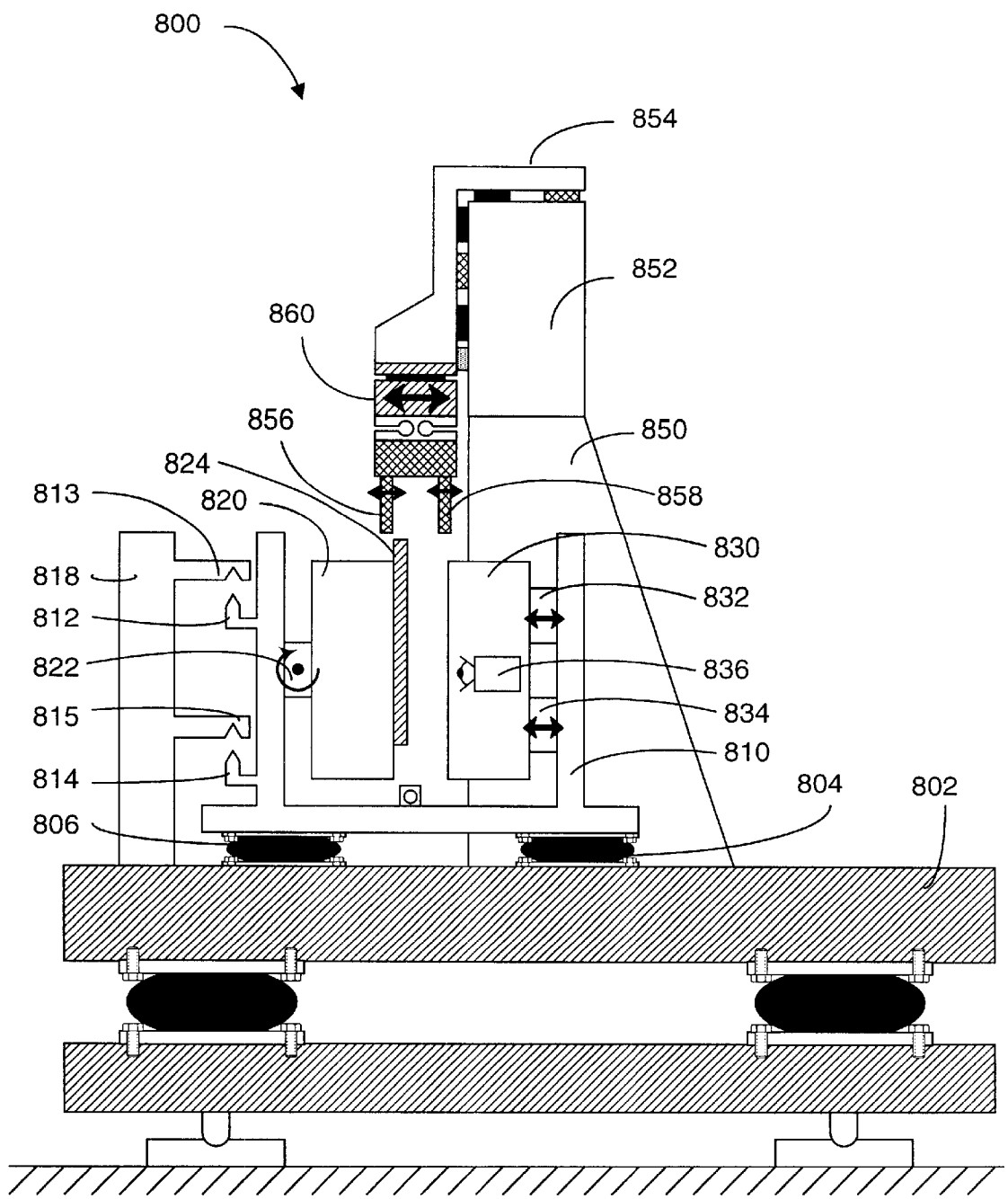
FIG. 8A illustrates one embodiment of the registration station, in accordance with the present invention.

FIG. 8A illustrates one embodiment of the registration section 800 in accordance with the present invention. The registration section 800 includes a foundation slab 802 which is shared by the image section (not shown). The vibration isolators 804, 806 are mounted to the foundation slab 802 and are operable to isolate the registration sub frame 810 from the foundation slab 802. Isolating the registration sub frame 810 from the foundation slab 802 substantially eliminates the transmission of vibrations from the registration section 800 to the image section.

The isolators 804, 806 can be air bellows or other viscous couplings capable of isolating the registration sub frame 810 from the foundation slab 802. Such viscous couplings can also include oil or water filled couplings or combinations thereof or any equivalents thereof. Docking or guide pins 812, 814 are mounted on the registration sub frame 810. Pin recesses or guide pin sockets 813, 815 are mounted to a portion 818 of the frame for the image section. The use of a combination of self-centering docking pins 812, 814 and pin recesses 813, 815 are but one embodiment. Other embodiments include precision channels and grooves or other equivalent mechanical, self-centering devices and a docking surface with a corresponding mating surface in lieu of the docking pins 812, 814 and pin recesses 813, 815. The registration sub frame 810 is docked to the portion 818 of the frame for the image section by raising or otherwise inflating the isolators 804, 806 so as to cause the entire registration sub frame 810 to move upwards. At a certain level, where the docking pins 812, 814 engage the pin recesses 813, 815, the registration sub frame 810 will enter into a repeatably accurate position. In an alternative embodiment, the registration sub frame 810 does not move to undock or disengage from the imaging section. The vibration isolators 804, 806 can also be optional in alternative embodiments although such alternative embodiments would likely be slower so as to not load a panel 824 into the registration system 800 at the same time another panel is being imaged. Such an alternative embodiment would therefore be substantially slower than the having some method of isolation between the registration section 800 and the imaging section but provides the benefit of a simpler apparatus.

A vacuum table 820 is attached to the registration sub frame 810 via a pivot 822. See for example, U.S. patent application Ser. No. 09/447,184 to Vernackt filed Nov. 22, 1999, entitled AUTOMATICALLY ADAPTING VACUUM HOLDER, and assigned to the assignee of the present invention, for an example of a vacuum table that may be used in the present invention. A panel 824 is shown being held by the vacuum table 820. A transparent panel 830 is attached to the registration sub frame 810 via a plurality of extenders 832, 834. A plurality of cameras 836 (only one shown) are attached to the transparent panel 830. A portion of the vertical support 850 and top rail 852 for the image section are also shown. The exposing carriage 854 is slideably attached to the top rail 852. A plurality of panel grippers 856, 858 are attached to the exposing carriage 854 via a plurality of lateral adjusters 860.

In one embodiment, the transparent panel 830 has a grid mask on it and a plurality of cameras 836 to accurately and quickly measure the position of a plurality of targets which are located on the panel 824. In an alternative embodiment, only one camera 836 is mounted in an X-Y coordinate frame such that the camera 836 is moved from one target location to second or other subsequent target locations using a high resolution encoder. An embodiment using one camera 836 in combination with an X-Y coordinate frame would require additional registration time and further, require targets be more specifically located on the panel.

Before the transfer of the panel 824 from the loading section to the registration section, the registration section is checked to ensure the registration section is ready to accept a new panel i.e. does not have a panel currently in the registration section. In another embodiment, before the panel flipper returns to "home" position in the load zone, the push plate (not shown) is retracted. Retracting the push plate provides the possibility to move the panel flipper backwards, with the panel hanging vertically on the vacuum table 820. In an alternative embodiment, the push plate can be part of the panel flipper. If the push plate is part of the panel flipper, the transparent plate 830 is not needed. In still another embodiment where the loading section includes a first vacuum table, the same first vacuum table can serve as the push plate, which is thus part of the panel flipper. The use of such a first vacuum table has the advantage that the panel 824 is flattened during the load process and a flat panel 824 is presented to the vacuum table 820 in the registration section.

Also after the panel is brought in front of the vacuum table 820, first compressed air is applied to create an air flow escaping from both the vacuum table 820 and the plate 830. The air flow creates an air cushion when the plate 830 comes towards the vacuum table 820. In this method the panel 824 is sandwiched between the vacuum table 820 and the plate 830. The low friction of the air cushion assists in flattening the panel 824 without damaging the panel 824 during the sandwich operation. Next, the airflow in the vacuum table 820 is stopped and vacuum is applied. For a short period of time, compressed air is escaping from the plate 830. The vacuum causes the panel 824 to be fixed onto the vacuum table 820. Next, the grippers of the panel flipper release the panel. In an embodiment where the plate 830 is part of the camera section, the plate 830 is retracted. Then the panel flipper can then return to the loading section to pick-up the next panel.

When a panel 824 is loaded into the registration section 800, the vacuum table 820 applies a vacuum to the panel 824 to securely hold the panel 824. Next, the transparent plate 830 is pressed against the panel 824 via the extenders 832, 834. Pressing the panel 824 against the vacuum table 820 with the transparent plate 830 results in a very tight sandwich-type structure. The sandwich-type structure flattens and smoothes the panel 824 so as to further reduce potential registration errors. Next, the cameras 836 determine the location of the targets on the panel 824. The targets may be any type of marking, or a hole, or, on multi-layered panels, may be a point located on an earlier layer that is detectable by the cameras 836. Determining the location of a plurality of targets determines the delta theta rotation error. Next the delta theta rotation error is substantially eliminated by first very slightly retracting the transparent plate 830 via the extenders 832, 834 and then rotating the vacuum table 820 via the pivot 822. The pivot 822 can include a motor with a gearbox. The gear box provides a highly accurate position resolution. The vacuum table 820 can mechanically rotate over a very small angle to substantially remove the delta theta error in the panel 824. Next, the two scale factors in X and Y direction are searched using at least three targets. Using a grid system and a dynamic range vision system, the registration process occurs very quickly. After the last scan line is applied to the previous panel i.e. the imaging section has completed the imaging process on any previous panel, the registration sub frame 810 is raised to cause the docking pins 812, 814 to engage the portion 818 of the frame for the image section. In one embodiment, the registration sub frame 810 is raised by increasing the pressure of or otherwise causing the isolators 804, 806 to extend. In an alternative embodiment the registration sub frame 810 is raised by other methods separate from the isolators 804, 806 such as a mechanical lifting device such as a hydraulic or air cylinder, a screw or geared lifting device. Next the grippers 856, 858 grip the panel 824. Optionally, next the cameras 836 check the location of the targets once again. If any additional delta theta errors are detected, then the grippers 856, 858 release the panel and the vacuum table 820 readjusts to further substantially eliminate the delta theta error as described above. Then the transparent plate 830 is retracted away from the panel 824 and the vacuum is released from the vacuum table 820. Optionally, to assist in releasing the panel from the vacuum table 820, pressurized air or some other gas or combination of gases can be applied to the vacuum table 820. Then, the vacuum table 820 is lowered to its original position. In yet another embodiment, two registration systems can be utilized, one system for each side of the panel 824. Each registration system will be equipped with a transparent plate 830 and cameras 836. Both registration systems move toward each other and sandwich the panel 824 to hold it in place. Such a dual sided registration system can provide highly detailed registration information for each side of the panel 824. In such and embodiment, each side of the panel 824 is treated individually and the correct delta theta error correction information for each side is transmitted to the corresponding imaging head in the imaging section. Such a dual sided registration system can be of great benefit when, for example, a panel 824 is drilled with a small diameter drill and the resulting hole is not precisely straight due to drill run out or some other tolerance or machine wear or operator error. The holes on either side of the panel 824 can be located differently. The error from one side of the panel 824 to the other side could be as great as 15 microns and the imaging section can correct and compensate for such an error.

Next, the panel is rotated so that the vertical line between two reference points at top and bottom of the panel are parallel to the scan line. This can be accomplished mechanically by rotating the vacuum plate using a motor with a gearbox. The gear box provides a highly accurate position resolution. During this rotation, the vision system checks the position of the two targets and forms a closed loop with the driver or controller of the motor.

Figure 8B:
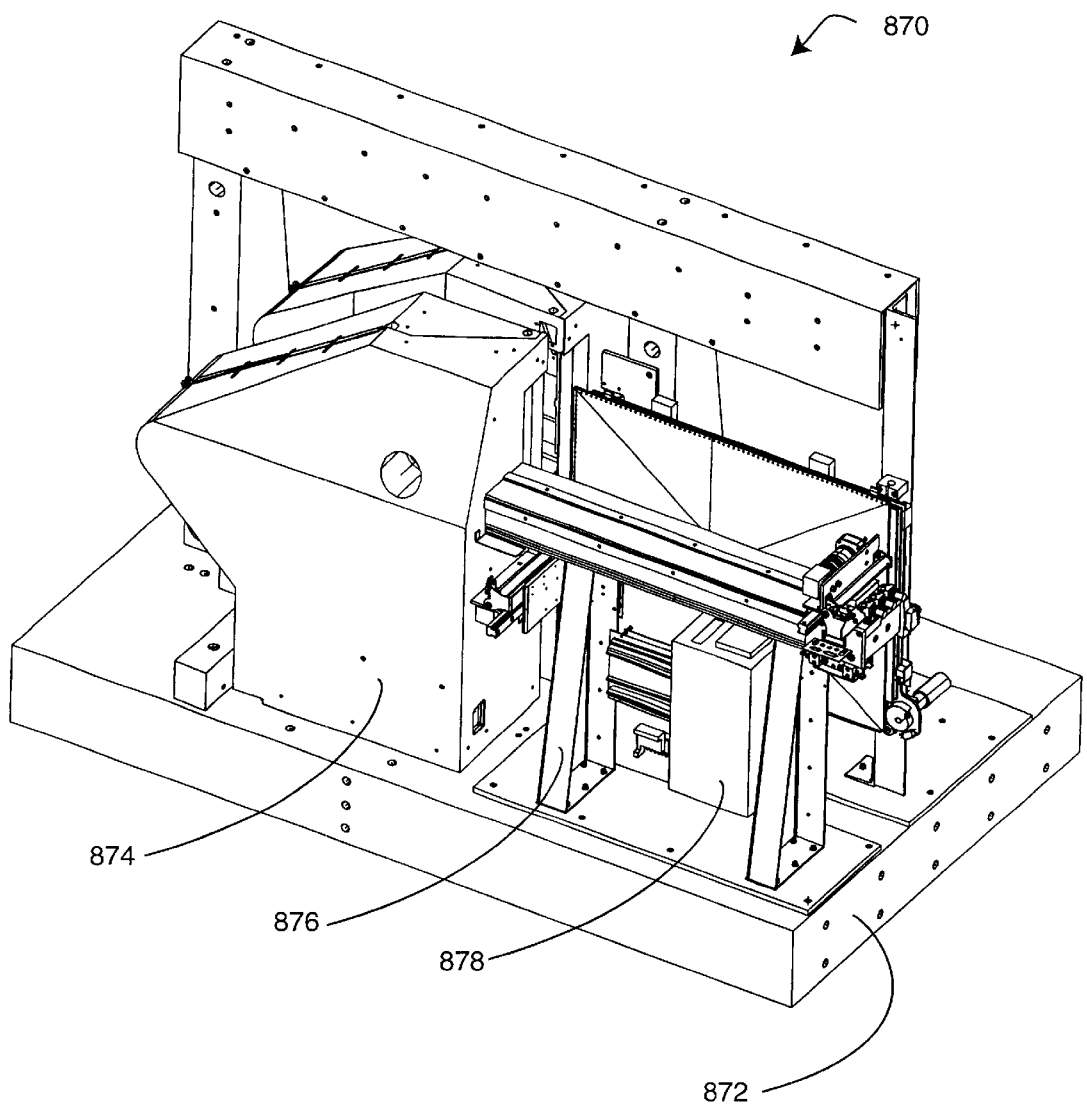
FIG. 8B illustrates one embodiment of the registration station, in accordance with the present invention.

FIG. 8B illustrates another embodiment of the registration section 870. The registration section 870 includes a foundation slab 872 which is shared by the image section 874. A registration sub frame 876 and a registration control system 878 are included in the registration section 870.

FIGS. 9A and 9B illustrates a panel 910 being carried via the exposing carriage 905 through the dual side imager 915. In an alternative embodiment, a plurality of exposing carriages 905 may be included. A plurality of exposing carriages 905 can further reduce the cycle time of the imaging process. A second or subsequent exposing carriage 905 could pick up a subsequent panel from the registration section and begin moving it toward the imaging section before the previous exposing carriage 905 returned to home position. In an embodiment having a plurality of exposing carriages 905 panels are effectively placed next to each other at the scan line position. This simulates a panel having an endless length. The process throughput time would then be substantially determined by the imaging speed and additional handling time would not be needed. This embodiment creates the optimum arrangement and use with the highest production efficiency.

When the last scan line is set onto the previous panel, the grippers mounted on the exposing carriage 905 will open. The previous panel will fall downwards in a controlled manner and will be picked up by the unloading section. At that time the registration section is raised to dock to the image section. The exposing carriage 905 then returns to its home position at a relative high speed. The home position of the exposing carriage 905 is in the registration section to pick-up the next panel 910. During the return of the exposing carriage 905, the grippers are in an open state and will glide over the top edge of the panel 910 being held in the registration section.

Once in position, the grippers close on the panel 910. Until the grippers close on the panel 910, the registration system can continuously check if the panel is still in registration.

Next, the vacuum in the vacuum table in the registration section is released and compressed air is applied. The push plate then retracts so that the push plate-panel-vacuum table sandwich is disassembled. The exposing carriage 905 then moves forward at a relative high speed to the beginning of the scan line is reached. In the same time a synchronization between the speed of the exposing carriage and the speed of the polygon motor is established, where the polygon motor speed determines the vertical span of the laser direct imager. Upon entering the panel between the optical heads, the optical heads are set at a wider range from each other. Before the scanning begins, the optical scanning heads are brought in close proximity to the panel. The panel hangs vertically, so that the panel's weight helps maintain the straight, vertical orientation of the panel. A pair of guides below the optical heads, establish an air bearing on either side of the panel. The guides and resulting air bearing enable a very precise vertical position of the panel.

Next, the scanning begins. Simultaneously, the registration sub frame is lowered so that the registration sub frame disengages from the imaging section and returns to a lowered position, ready to accept the next panel for registration. The scanning process is the dominating process and depends on many variables such as available laser power, resolution, resist sensitivity, etc.

Figure 10:
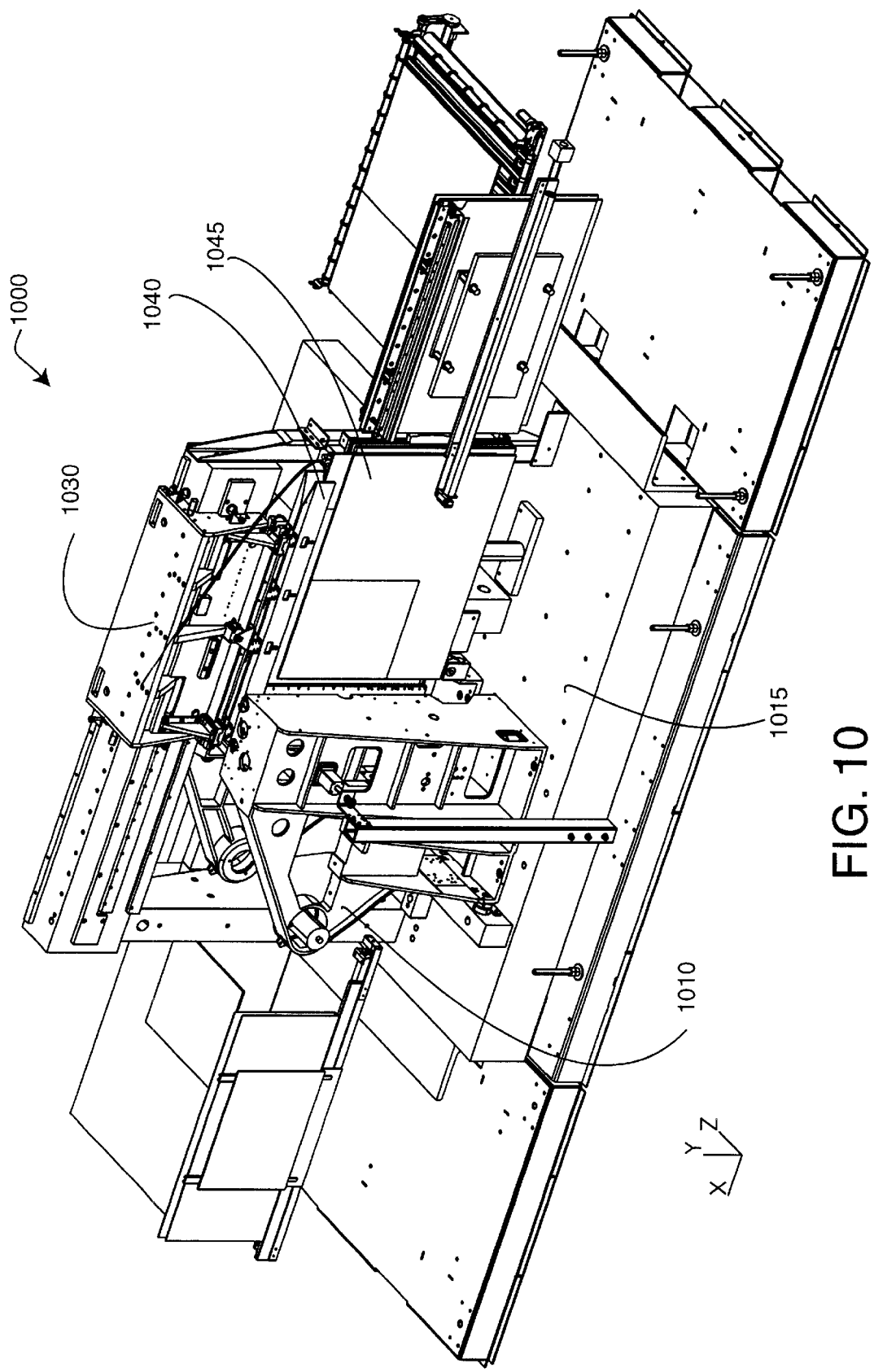
FIG. 10 illustrates one embodiment of a dual side direct imager 1000 in accordance with the present invention.

FIG. 10 illustrates one embodiment of a dual side direct imager 1000 in accordance with the present invention. The dual side direct imager 1010 is mounted on the foundation slab 1020. The exposing carriage 1030 and the grippers 1040 are shown gripping a panel 1045. The registration section is not shown for clarity. Any dual side direct imager is suitable for use in the present invention. One embodiment of the dual side direct imager suitable for the present invention is disclosed in co-pending U.S. patent application Ser. No. 09/435,983, entitled: METHOD AND DEVICE FOR EXPOSING BOTH SIDES OF A SHEET, by Inventor(s): Marc Vernackt, Ronny De Loor, Anne-Marie Empsten, and Mark Ryvkin, filed: Nov. 8, 1999, which is incorporated by reference herein for all purposes.

Figure 11B:
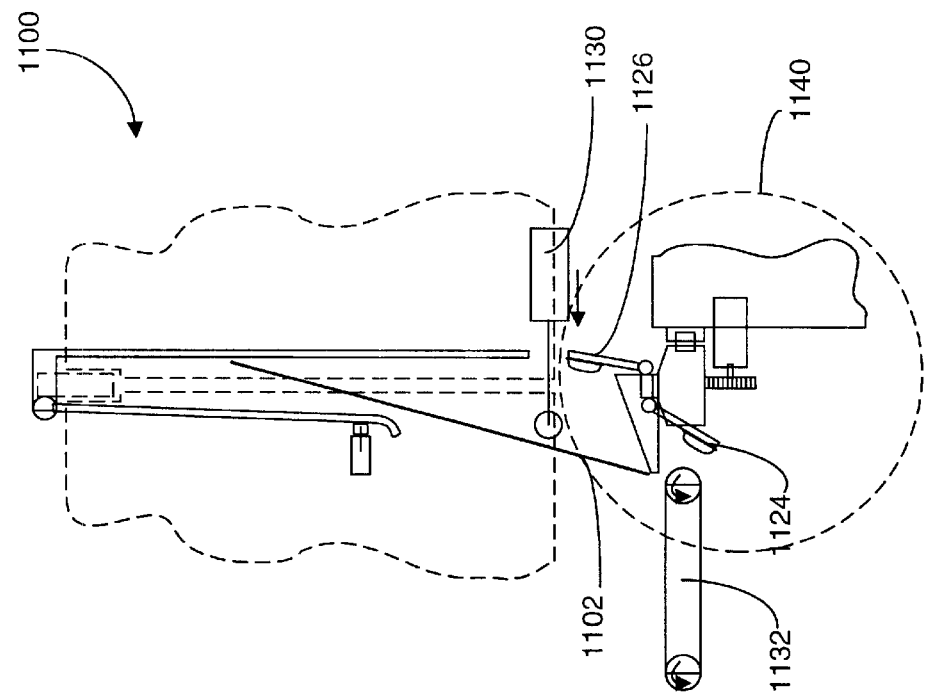
FIGS. 11A–11B illustrates one embodiment of the panel unload section 1100 in accordance with the present invention.
Figure 11A:
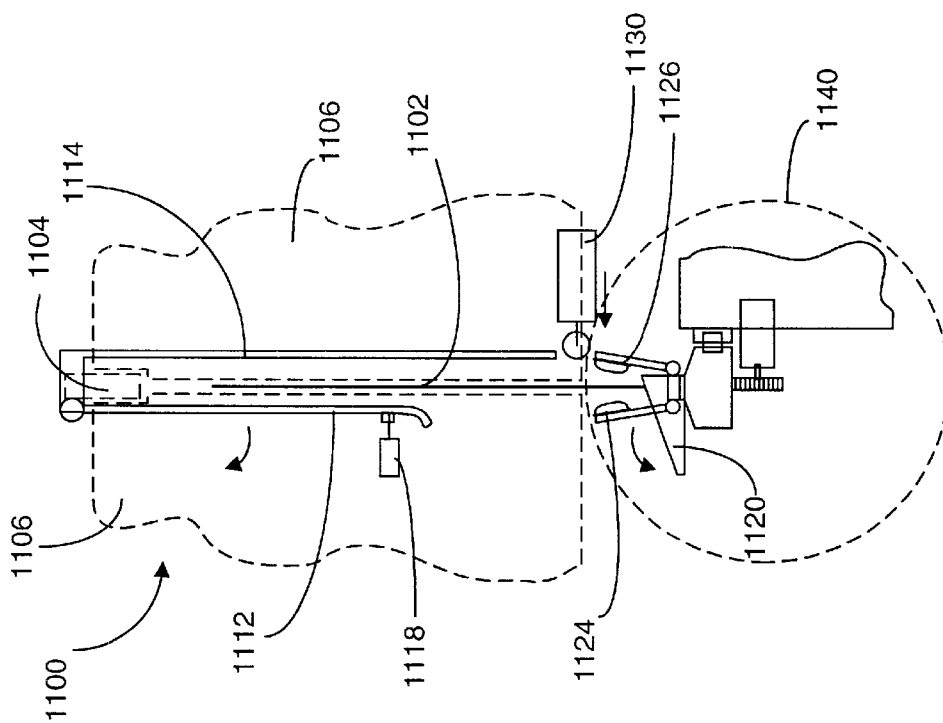

FIGS. 11A and 11B illustrate one embodiment of the panel unload section 1100 in accordance with the present invention. The front plate 1112 and rear plate 1114 ensure panel maintains vertical position during movement of the panel 1102 and protects the panel 1102. The panel 1102 is carried on the exposure carriage 1104 until the panel clears the scan lines in the imaging section 1106. The panel 1102 is then released and falls to the shock absorbing ramp 1120. The shock absorbing ramp 1120, the front holder 1124 and the rear holder 1126 are included in the unload system 1140. The unload system 1140 moves towards the unload section, holding and thus moving the panel 1102 toward the unload table 1132. In FIG. 11B the front plate actuator 1118 is then retracted to cause the front plate 1112 open and allow the panel 1102 to move down the shock absorbing ramp 1120. The front holder 1124 is then released and the panel pusher 1130 is actuated causing the panel 1102 to move down the shock absorbing ramp 1120 toward the unload table 1132. The unload table 1132 can also include rollers or robot arms or other mechanical methods to pull or cause the panel 1102 to continue moving the panel 1102 away from the unload section 1100. In an alternative embodiment, the unload pick-up system 1140 is raised prior to the panel 1102 being released from the exposure carriage 1104. Raising the unload pick-up system 1140 reduces the distance the panel 1102 falls and therefore the falling speed.

In the preferred embodiment, each section, i.e.: load section, registration section, image section and unload section, are automatically controlled by a controller or a plurality of individual controllers in communication with each other. The controller utilizes a control logic to operate the individual sections. Each section can be operated independently but in coordination with the other sections to rapidly process panels in parallel. The controller can be an embedded PC, running control software.

In other alternative embodiments other types of controllers well known to one skilled in the art such as sequential logic controllers, PLCs and other controllers may also be used.

Figure 12:
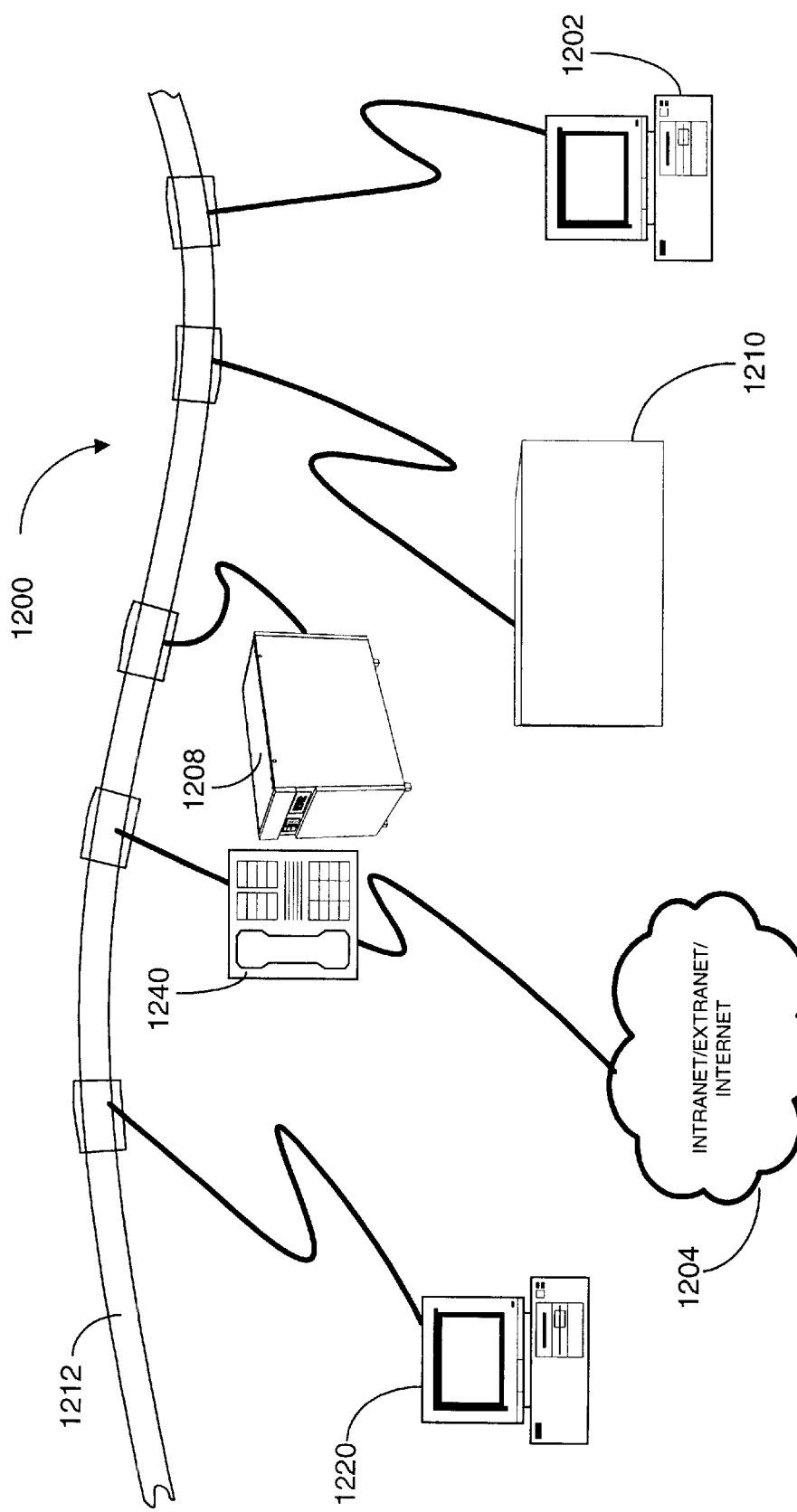
FIG. 12 illustrates an embodiment of a local area network (LAN) 1200 in accordance with the present invention.

FIG. 12 illustrates an embodiment of a local area network (LAN) 1200 in accordance with the present invention. The LAN 1200 includes interconnections between the of the controller 1202 of an automated, flow-through, dual side, laser direct imaging apparatus and the extranet 1204. Also connected to the LAN 1200 are the raster imaging bank (RIP) bank 1208 a main file server to the LDI 1210 and a work station 1220. Other work stations and peripheral connections may also be connected to the LAN 1200. The extranet 1204 can include the internet.

While various embodiments have been described above, it should be understood that they have been presented by way of example only, and not limitation. Thus, the breadth and scope of a preferred embodiment should not be limited by any of the above described exemplary embodiments, but should be defined only in accordance with the following claims and their equivalents.

What is claimed is:

1. An apparatus for automated imaging a sensitized panel comprising:
   a loading station mounted on a floor surface;
   a registering station detachably docked to an imaging station such that the registering station may be a docked to said imaging station or mechanically isolated from said imaging station;
   an imaging station; and
   an unloading station mounted on a floor surface;
   such that a panel can be loaded, then be moved to said registering station, then registered in said registering station with respect to the registering station while said registering station is isolated from said imaging station, then transferred to said imaging station while said registering station is docked to said imaging station, then imaged in said imaging station while said registering station is mechanically isolated from said imaging station, and then unloaded, such that said imaging of said panel can occur simultaneously to the registering of a second panel.

2. An apparatus as recited in claim 1, wherein said imaging station images said panel in a vertical orientation.

3. An apparatus as recited in claim 1, wherein the loading station, registration station, imaging station and unloading station automatically work in sequence without operator intervention.

4. An apparatus as recited in claim 2, wherein said loading station includes a first panel flipper to flip said panel from a horizontal position to a vertical position.

5. An apparatus as recited in claim 1, wherein said loading station includes a panel pre-registering system.

6. An apparatus as recited in claim 1, wherein said loading station includes a vacuum table.

7. An apparatus as recited in claim 1, wherein said loading station includes an air table wherein the panel can be supported on a layer of air.

8. An apparatus as recited in claim 1, wherein said registering station includes:
   a first isolator system mounted to said imaging station and operable to mechanically isolate said registering station from said imaging station;
   a registration sub frame mounted to said first isolator system, said registration sub frame having a docking surface, said docking surface operable to mate to a receiving surface on said imaging station;
   a first panel holder operable to hold the panel, said first panel holder pivotally attached to said registration sub frame; and
   a camera system operable to detect a plurality of targets on the panel.

9. An apparatus as recited in claim 8, wherein said first panel holder has grippers.

10. An apparatus as recited in claim 8, wherein said first panel holder has a vacuum table.

11. An apparatus as recited in claim 8, wherein said first isolator system has air bellows and said air bellows are operable to move said registration sub frame from a docked position to a load position.

12. An apparatus as recited in claim 1, wherein said imaging station includes:
   a second isolator system mounted on said floor surface;
   a base coupled to said second isolator system, said second isolator system operable to mechanically isolate said base from said floor surface, said base oriented horizontally;
   a plurality of vertical supports coupled to said base;
   a top rail coupled to said vertical supports;
   a panel carrier, wherein said top rail is operable to slideably support said panel carrier; and
   an imager mounted on said base.

13. An apparatus as recited in claim 12, wherein said panel carrier includes a plurality of panel carriers.

14. An apparatus as recited in claim 1, further comprising a controller.

15. An apparatus as recited in claim 14, wherein said controller includes a computer and an electronic network.

16. An apparatus as recited in claim 15, wherein said electronic network includes a computer network supporting at least one of a group consisting of Internet (IP) protocol, local area network (LAN) priority, wide area network (WAN).

17. An apparatus as recited in claim 14, wherein said controller is capable to control a plurality of processes independently.

18. An apparatus as recited in claim 1, wherein said unloading station includes a second panel flipper.

19. An apparatus for automated imaging a sensitized panel comprising:
   a loading station including a first panel flipper;
   a registering station including:
      a first isolator system mounted to said imaging station and operable to mechanically isolate said registering station from said imaging station;
      a registration sub frame mounted to said first isolator system, said registration sub frame having a docking surface, said docking surface operable to mate to a receiving surface on said imaging station;
      a first panel holder operable to hold a first panel, said first panel holder pivotally attached to said registration sub frame; and
      a camera system operable to detect a plurality of targets on said first panel;
   an imaging station aligned to said registering station including:
      a second isolator system mounted on said floor surface;
      a base coupled to said second isolator system, said second isolator system operable to mechanically isolate said base from said floor surface, said base oriented horizontally;

a plurality of vertical supports coupled to said base;

a top rail coupled to said vertical supports;

a panel carrier, wherein said top rail is operable to slideably support said panel carrier; and an imager mounted on said base; and an unloading station aligned to said imaging station including a second panel flipper, said unloading station mounted on said floor surface, and being mechanically isolated from said imaging station; whereby a sensitized panel can be moved to said registering station, said sensitized panel registered in said registering station with respect to the registering station, said registering station docked to said imaging station, imaging said sensitized panel in said imaging station and then unloading said sensitized panel.

20. An apparatus as described in claim 1, wherein the imaging station is a direct imaging station.

21. An apparatus as recited in claim 1, wherein said imaging station is a two-sided imaging station capable of imaging both sides of said panel simultaneously.

22. An apparatus as described in claim 19, wherein the imaging station is a direct imaging station.

23. An apparatus as recited in claim 19, wherein said imaging station is a two-sided imaging station capable of imaging both sides of said panel simultaneously.

24. An apparatus for automated imaging a sensitized panel comprising:

a registering station; detachably docked to a direct imaging station such that the registering station may be docked to said imaging station or mechanically isolated from said imaging station; and an imaging station, such that a panel can be registered in said registering station with respect to the registering station while said registering station is isolated from said imaging station, then transferred to said imaging station while said registering station is docked to said imaging station, then imaged in said imaging station while said registering station is mechanically isolated from said imaging station, such that said imaging of said panel can occur simultaneously to the registering of a second panel.

25. An apparatus as described in claim 19, wherein the imaging station is a direct imaging station.

26. An apparatus as recited in claim 25, wherein said imaging station is a two-sided imaging station capable of imaging both sides of said panel simultaneously.

* * * * *

UNITED STATES PATENT AND TRADEMARK OFFICE
CERTIFICATE OF CORRECTION

PATENT NO. : 6,369,877 B2
DATED : April 9, 2002
INVENTOR(S) : Vernackt

It is certified that error appears in the above-identified patent and that said Letters Patent is hereby corrected as shown below:

Column 16,
Line 49, kindly change "a loading station" to -- a loading station on a floor surface --.

Signed and Sealed this

Nineteenth Day of October, 2004

JON W. DUDAS
*Director of the United States Patent and Trademark Office*